US012765058B2

(12) United States Patent
Jun et al.

(10) Patent No.: US 12,765,058 B2
(45) Date of Patent: Oct. 13, 2026

(54) GATE-ALL-AROUND DEVICES WITH DIFFERENT GATE OXIDE THICKNESSES

(71) Applicant: Intel Corporation, Santa Clara, CA (US)

(72) Inventors: Hwichan Jun, Portland, OR (US); Guillaume Bouche, Portland, OR (US)

(73) Assignee: INTEL CORPORATION, Santa Clara, CA (US)

(*) Notice: Subject to any disclaimer, the term of this patent is extended or adjusted under 35 U.S.C. 154(b) by 79 days.

(21) Appl. No.: 18/074,814

(22) Filed: Dec. 5, 2022

(65) Prior Publication Data

US 2024/0186327 A1 Jun. 6, 2024

(51) Int. Cl.

| | |
|---|---|
| ***H10D 86/60*** | (2025.01) |
| ***H10D 84/01*** | (2026.01) |
| ***H10D 84/03*** | (2025.01) |
| ***H10D 84/83*** | (2025.01) |
| ***H10D 86/01*** | (2026.01) |
| ***H10D 86/40*** | (2025.01) |

(52) U.S. Cl.

CPC ......... *H10D 86/60* (2025.01); *H10D 84/0142* (2025.01); *H10D 84/0144* (2025.01); *H10D 84/038* (2025.01); *H10D 84/83* (2025.01); *H10D 86/0221* (2025.01); *H10D 86/431* (2025.01)

(58) Field of Classification Search

CPC ............. H10D 84/0144; H10D 62/292; H10D 30/027–0278; H10D 30/43–435; H10D 62/119–123; H10D 30/014; H10D 30/63; H10D 84/016; H10D 84/0195; H10D 62/121; H10D 86/60; H10D 84/0142; H10D 84/038; H10D 84/83; H10D 86/0221; H10D 86/431; H10D 30/6735; H10D 30/6757; H10D 84/014; H10D 64/514; H10D 84/834; H10D 64/512; H10B 63/34; Y10S 977/938; B82Y 40/00

See application file for complete search history.

(56) References Cited

U.S. PATENT DOCUMENTS

| | | | | |
|---|---|---|---|---|
| 10,177,235 | B2 * | 1/2019 | Balakrishnan | H10D 30/6735 |
| 11,984,487 | B2 * | 5/2024 | Ma | H10D 30/014 |
| 12,166,124 | B2 * | 12/2024 | Hickey | H10D 30/6212 |
| 12,249,622 | B2 * | 3/2025 | Trivedi | H10D 30/014 |
| 2010/0214012 | A1 * | 8/2010 | Raza | B82Y 10/00 977/734 |

(Continued)

*Primary Examiner* — Maliheh Malek

(74) *Attorney, Agent, or Firm* — Arcane Law PLLC

(57) ABSTRACT

Techniques are provided herein to form semiconductor devices having different gate oxide thicknesses. A first semiconductor device includes a first gate structure around a first plurality of semiconductor nanoribbons and a second semiconductor device includes a second gate structure around a second plurality of semiconductor nanoribbons. The first gate structure includes at least a first gate oxide layer and a first gate electrode, and the second gate structure includes at least a second gate oxide layer and a second gate electrode. The first gate oxide layer is thicker than the second gate oxide layer. A high-k dielectric layer may be formed over the first and second gate oxide layers or may be formed over the second gate oxide layer, but not over the first gate oxide layer.

20 Claims, 15 Drawing Sheets

(56) References Cited

U.S. PATENT DOCUMENTS

2014/0353574 A1* 12/2014 Li ...................... H10D 30/6735 438/284
2015/0311286 A1* 10/2015 Lee ...................... H10D 30/024 438/157
2017/0194357 A1* 7/2017 Balakrishnan ......... B82Y 10/00
2017/0200738 A1* 7/2017 Kim ..................... H10D 30/014
2020/0006559 A1* 1/2020 Mehandru .............. B82Y 10/00
2020/0044087 A1* 2/2020 Guha ................... H10D 30/014
2020/0098882 A1* 3/2020 Lee ........................ B82Y 10/00
2020/0105751 A1* 4/2020 Dewey ................... B82Y 10/00
2020/0176328 A1* 6/2020 Chang .................... B82Y 10/00
2020/0176582 A1* 6/2020 Rode ...................... B82Y 10/00
2020/0219990 A1* 7/2020 Guha ..................... B82Y 10/00
2020/0294998 A1* 9/2020 Lilak ...................... B82Y 10/00
2021/0225839 A1* 7/2021 Lin ...................... H10D 30/024
2021/0257258 A1* 8/2021 Huang ............... H10D 64/0134
2021/0305380 A1* 9/2021 Bouche .............. H10D 30/6211
2021/0359103 A1* 11/2021 Xie ...................... H10D 30/014
2021/0384299 A1* 12/2021 Ma ....................... H10D 30/014
2021/0384313 A1* 12/2021 Cheng .................. H10D 30/014
2021/0408285 A1* 12/2021 Hickey .............. H10D 30/6212
2022/0293731 A1* 9/2022 Lee ...................... H10D 30/014
2022/0375916 A1* 11/2022 Gomes ................... H10B 12/05
2022/0375939 A1* 11/2022 Sharma .................. H10B 12/05
2023/0089395 A1* 3/2023 Orr ........................ B82Y 10/00 257/369
2023/0120117 A1* 4/2023 Hsu ...................... H10D 30/014 257/288
2023/0123987 A1* 4/2023 Cheng .................. H10D 30/014 257/288
2023/0134379 A1* 5/2023 Huang ............... H10D 30/6735 257/288
2023/0139258 A1* 5/2023 Hou ..................... H10D 30/014 257/401
2023/0141914 A1* 5/2023 Agrawal .............. H10D 30/014 257/401
2023/0147499 A1* 5/2023 Agrawal .............. H10D 30/014 257/288
2023/0163170 A1* 5/2023 Ostermayr ........... H10D 62/121 257/288
2023/0192735 A1* 6/2023 Mokhtarzadeh ...... C07F 11/005
2023/0197724 A1* 6/2023 Majhi .................. H10D 30/031
2023/0253476 A1* 8/2023 Sen Gupta ............. H10B 12/03 257/288
2024/0006499 A1* 1/2024 Huang ............... H10D 30/0243
2024/0088265 A1* 3/2024 Chu ..................... H10D 30/014
2024/0096948 A1* 3/2024 Hook ................... H10D 30/014
2024/0113104 A1* 4/2024 Yemenicioglu ...... H10D 30/014
2024/0120239 A1* 4/2024 Chang ................ H10D 30/6735
2024/0194673 A1* 6/2024 Jun ........................ H10D 30/62
2024/0203739 A1* 6/2024 Ghosh .................. H10D 30/014
2024/0204060 A1* 6/2024 Galatage .............. H10D 30/014
2024/0204064 A1* 6/2024 Bouche ................ H10D 30/014
2024/0321962 A1* 9/2024 Chu ..................... H10D 30/014
2025/0063792 A1* 2/2025 You ...................... H10D 30/014
2025/0113564 A1* 4/2025 Guler ................. H10D 30/6735
2025/0169130 A1* 5/2025 Chu ................... H10D 30/0193
2025/0294827 A1* 9/2025 Bouche .................. H10D 30/47
2025/0294846 A1* 9/2025 Jun ........................ H10D 30/43
2025/0301708 A1* 9/2025 Koh ..................... H10D 30/014
2025/0311298 A1* 10/2025 Jun ...................... H10D 30/014
2025/0311353 A1* 10/2025 Zhang .................. H10D 30/014
2025/0359146 A1* 11/2025 Sharma ................ H10D 30/019
2025/0366031 A1* 11/2025 Chen .................... H10D 30/014
2025/0374603 A1* 12/2025 Li ........................ H10D 30/014
2025/0380502 A1* 12/2025 Li ........................ H10D 30/014
2026/0006911 A1* 1/2026 Koh ..................... H10D 30/014
2026/0006912 A1* 1/2026 Mangu ................. H10D 30/014
2026/0059801 A1* 2/2026 Li ...................... H10D 30/6735
2026/0090092 A1* 3/2026 Lee ...................... H10D 30/014
2026/0096120 A1* 4/2026 Lee ...................... H10D 30/014

* cited by examiner

GATE-ALL-AROUND DEVICES WITH DIFFERENT GATE OXIDE THICKNESSES

FIELD OF THE DISCLOSURE

The present disclosure relates to integrated circuits, and more particularly, to gate-all-around semiconductor devices.

BACKGROUND

As integrated circuits continue to scale downward in size, a number of challenges arise. For instance, reducing the size of memory and logic cells is becoming increasingly more difficult. Different transistor architectures that maximize available semiconductor surfaces to form active channels have been contemplated, including nanosheet (e.g., gate-all-around) and forksheet architectures. However, such architectures come with drawbacks with regards to the small dimensions between the semiconductor regions. For some devices, these small dimensions limit the capabilities of the devices. Accordingly, there remain a number of non-trivial challenges with respect to forming certain transistor structures.

Figure 1A:
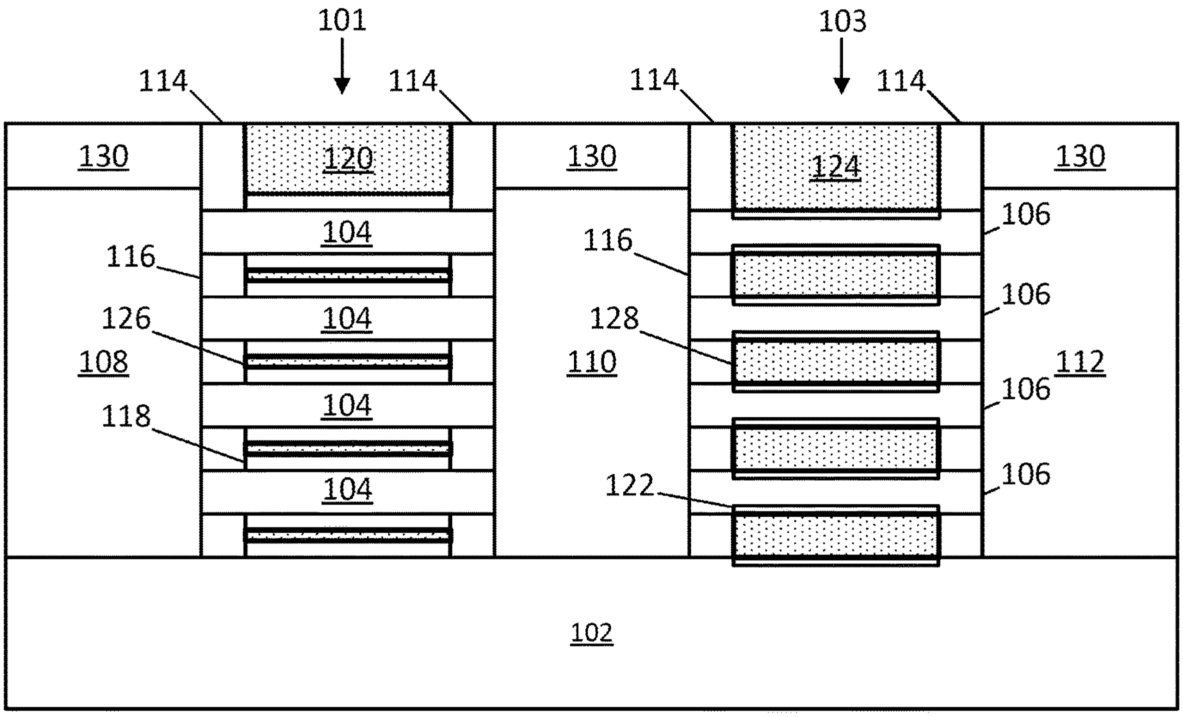
FIG. 1A is a cross-sectional view of a pair of semiconductor devices that illustrates different gate oxide thickness between the devices, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form semiconductor devices having different gate oxide thicknesses. The techniques can be used in any number of integrated circuit applications and are particularly useful with respect to gate-all-around (GAA) transistors (e.g., ribbonFETs and nanowire FETs). In an example, a first semiconductor device includes a first gate structure around a first semiconductor region and a second semiconductor device includes a second gate structure around a second semiconductor region. The first and second semiconductor regions can be or one or more nanowires or nanoribbons or nanosheets of semiconductor material that extend from a source region to a drain region. The first gate structure includes at least a first gate oxide layer and a first gate electrode (e.g., conductive material such as workfunction material and/or gate fill metal), and the second gate structure includes at least a second gate oxide layer and a second gate electrode. The first gate oxide layer is thicker than the second gate oxide layer. For example, the first gate oxide layer may be at least 2 nm thicker than the second gate oxide layer. In some examples, a high-k dielectric layer may also be formed over the first and second gate oxide layers. In some other examples, a high-k dielectric layer is formed over the second gate oxide layer, but not over the first gate oxide layer. Numerous variations and embodiments will be apparent in light of this disclosure.

General Overview

As previously noted above, there remain a number of non-trivial challenges with respect to integrated circuit fabrication. In more detail, as devices become smaller and more densely packed, many structures become more challenging to fabricate as critical dimensions (CD) of the structures push the limits of current fabrication technology. GAA devices provide efficient use of limited chip footprint by providing several semiconductor regions (e.g., nanoribbons) in a single device. However, the geometry of such structures leaves little room between the nanoribbons for the formation of critical structures such as gate oxides and any conductive gate layers. Some applications require the use of higher power devices coupled to I/O ports or the voltage rails, and such devices may need thicker gate oxides to handle the higher current. Forming the thick gate oxides for such devices is challenging due to the aforementioned limited spacing between nanoribbons and due to overconsumption of the semiconductor region during gate oxide growth. One possible approach might be to not release the nanoribbons in the thick gate oxide portion of a given die, which may help prevent overconsumption of the semiconductor region during gate oxide growth. However, a large portion of channel area would still be lost by virtue of the sacrificial material remaining in the channel region.

Thus, and in accordance with an embodiment of the present disclosure, techniques are provided herein to form GAA semiconductor devices with different gate oxide thicknesses. In other words, one or more first GAA devices include a thicker gate oxide compared to one or more second GAA devices on the same substrate. In some examples, the one or more first GAA devices have a gate oxide layer that is at least 1 nm thicker, at least 2 nm thicker, or at least 3 nm thicker than the gate oxide layer of the one or more second GAA devices. According to some embodiments, a layer of crystalline silicon may be formed around the nanoribbons of the one or more first GAA devices and subsequently oxidized to form a first gate oxide layer (e.g., the thicker gate oxide layer) around the nanoribbons of the one or more first GAA devices. By depositing additional silicon and then oxidizing, less of the original nanoribbons is consumed during the oxide growth process. A second gate oxide layer (e.g., the thinner gate oxide) may then be formed over the nanoribbons of the one or more second GAA devices by performing another oxide growth process to form a thinner gate oxide compared to the first gate oxide layer. In some embodiments, another dielectric layer comprising a high-k dielectric material (e.g., dielectric constant higher than 6.5) is formed on both the first and second gate oxide layers. In some other embodiments, the dielectric layer comprising a high-k material is formed on the second gate oxide layer but not on the first (thicker) gate oxide layer. The high-k material may be hafnium oxide although other high-k materials could be used as well. Numerous variations and embodiments will be apparent in light of this disclosure.

According to an embodiment, an integrated circuit includes a first semiconductor device having a first semiconductor region extending in a first direction between a first source region and a first drain region, and a first gate structure extending in a second direction over the first semiconductor region, and a second semiconductor device having a second semiconductor region extending in the first direction between a second source region and a second drain region, and a second gate structure extending in the second direction over the second semiconductor region. The first gate structure has a first gate dielectric structure and a first gate electrode on the first gate dielectric structure and the second gate structure has a second gate dielectric structure and a second gate electrode on the second gate dielectric structure. The first gate dielectric structure includes a first gate oxide layer and the second gate dielectric structure includes a second gate oxide layer. The first gate oxide layer is at least 2 nm thicker than the second gate oxide layer.

According to another embodiment, an integrated circuit includes a first semiconductor device having a plurality of first semiconductor nanoribbons extending in a first direction between a first source region and a first drain region, and a first gate structure extending in a second direction over the plurality of first semiconductor nanoribbons, and a second semiconductor device having a plurality of second semiconductor nanoribbons extending in the first direction between a second source region and a second drain region, and a second gate structure extending in the second direction over the plurality of second semiconductor nanoribbons. The first gate structure has a first gate dielectric structure and a first gate electrode on the first gate dielectric structure and the second gate structure has a second gate dielectric structure and a second gate electrode on the second gate dielectric structure. The first gate dielectric structure includes a first gate oxide layer and the second gate dielectric structure includes a second gate oxide layer. The first gate oxide layer is thicker than the second gate oxide layer (e.g., by 2 nm or more). The nanoribbons of the plurality of first semiconductor nanoribbons have a greater midpoint thickness compared to a midpoint thickness of the nanoribbons of the plurality of second semiconductor nanoribbons. In one such example, nanoribbons of the first semiconductor nanoribbons have a midpoint thickness that is 1 nm or more thicker than a midpoint of the second semiconductor nanoribbons.

According to another embodiment, a method of forming an integrated circuit includes forming a first fin structure comprising first semiconductor material, the first fin structure extending above a substrate and extending in a first direction; forming a second fin structure comprising second semiconductor material, the second fin structure extending above a substrate and extending in the first direction; forming a first sacrificial dielectric layer over the first fin structure and a second sacrificial dielectric layer over the second fin structure; forming a first mask structure over the second fin structure and removing the first sacrificial dielectric layer over the first fin structure; forming a crystalline silicon layer over the first semiconductor material; oxidizing the crystalline silicon layer to form a first gate oxide layer on the first semiconductor material; forming a second mask structure over the first semiconductor material and removing the second dielectric layer over the second fin structure; and forming a second gate oxide layer on the second semiconductor material, wherein the first gate oxide layer is at least 2 nm thicker than the second gate oxide layer.

The techniques can be used with any type of non-planar transistors, but are especially useful for nanowire and nanoribbon transistors (sometimes called GAA transistors or forksheet transistors), to name a few examples. The source and drain regions can be, for example, doped portions of a given fin structure or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate one or more GAA devices having a thicker gate oxide (e.g., at least 2 nm thicker) compared to other GAA devices. In some examples, the GAA devices having the thicker gate oxide may have nanoribbons that are either the same thickness as or are thicker than the nanoribbons from the GAA devices with the thinner gate oxide. In another example, a dielectric layer having a high-k material, such as hafnium oxide, may be observed only over the GAA devices with the thinner gate oxide (and absent from the GAA devices with the thicker gate oxide).

It should be readily understood that the meaning of "above" and "over" in the present disclosure should be interpreted in the broadest manner such that "above" and "over" not only mean "directly on" something but also include the meaning of over something with an intermediate feature or a layer therebetween. As used herein, the term "backside" generally refers to the area beneath one or more semiconductor devices (below the device layer) either within the device substrate or in the region of the device substrate (in the case where the bulk of the device substrate has been removed). Note that the backside may become a frontside, and vice-versa, if a given structure is flipped. To this end, and as will be appreciated, the use of terms like "above" "below" "beneath" "upper" "lower" "top" and "bottom" are used to facilitate discussion and are not intended to implicate a rigid structure or fixed orientation; rather such terms merely indicate spatial relationships when the structure is in a given orientation.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

FIG. 1A is a cross-sectional view taken across a first semiconductor device 101 and a second semiconductor device 103, according to an embodiment of the present disclosure. Each of first and second semiconductor devices 101 and 103 may be any type of non-planar metal oxide semiconductor (MOS) transistor, such as a tri-gate, gate-all-around (GAA), or forksheet transistor, although other transistor topologies and types could also benefit from the techniques provided herein. The illustrated embodiments herein use the GAA structure.

First and second semiconductor devices 101 and 103 together represent a portion of an integrated circuit that may contain any number of similar semiconductor devices. Additionally, first and second semiconductor devices 101 and 103 are provided side-by-side for clarity and for ease of discussion when comparing and contrasting the devices. However, second semiconductor device 103 could exist anywhere else within the integrated circuit and is not required to be linked with first semiconductor device 101 via a shared source or drain region. The arrangement of first semiconductor device 101 sharing a source or drain region with second semiconductor device 103 may be used in various common circuit structures, such as an inverter.

As can be seen, semiconductor devices 101 and 103 are formed on a substrate 102. Any number of other semiconductor devices can be formed on substrate 102, but two are illustrated here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used.

First semiconductor device 101 may include any number of semiconductor nanoribbons 104 while second semiconductor device 103 similarly may include any number of semiconductor nanoribbons 106. Nanoribbons 104 may extend between a source region 108 and a drain region 110 along a first direction (e.g., across the page). Likewise, nanoribbons 106 may extend between a source region 112 and drain region 110 along the first direction. Any source region may also act as a drain region and vice versa, depending on the application. Furthermore, as noted above, nanoribbons 106 of second semiconductor device 103 may extend between source region 112 and a drain region that is different from drain region 110.

In some embodiments, semiconductor devices 101 and 103 have an equal number of nanoribbons, while in other embodiments they have an unequal number of nanoribbons. In some embodiments, each of nanoribbons 104 and nanoribbons 106 are formed from a fin of alternating material layers (e.g., alternating layers of silicon and silicon germanium) where sacrificial material layers are removed between nanoribbons 104 and nanoribbons 106. Each of nanoribbons 104 and nanoribbons 106 may include the same semiconductor material as substrate 102, or not. In still other cases, substrate 102 is removed. In some such cases, there may be, for example one or more backside interconnect and/or contact layers.

According to some embodiments, source and drain regions 108/110/112 are epitaxial regions that are provided using an etch-and-replace process. In other embodiments any of the source and drain regions could be, for example, implantation-doped native portions of the semiconductor fin structures. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. Any number of source and drain configurations and materials can be used.

According to some embodiments, the fin structures include alternating layers of material (e.g., alternating layers of silicon and silicon germanium (SiGe)) that facilitates forming of nanowires and nanoribbons during a gate forming process where one type of the alternating layers is selectively etched away so as to liberate the other type of alternating layers within the channel region, so that a gate-all-around (GAA) process can then be carried out. The alternating layers can be blanket deposited and then etched into fin structures, or deposited into fin-shaped trenches.

According to some embodiments, a first gate structure is provided over each of nanoribbons 104 between spacer structures 114 and inner spacers 116. Similarly, a second gate structure is provided over each of nanoribbons 106 between spacer structures 114 and inner spacers 116. The first and second gate structures each extend across the corresponding nanoribbons in a second direction (e.g., into and out of the page). The second direction may be orthogonal to the first direction. According to some embodiments, the first gate structure includes a first gate oxide layer 118 and a first gate electrode 120, and the second gate structure includes a second gate oxide layer 122 and a second gate electrode 124. Each of first gate oxide layer 118 and second gate oxide layer 122 may be a dielectric material having a relatively low dielectric constant between 4 and 6, as compared to high-k dielectrics such as hafnium oxide. For example, first gate oxide layer 118 and second gate oxide layer 122 may be silicon dioxide, silicon oxycarbonitride (SiOCN), silicon oxycarbide (SiOC), or silicon oxynitride (SiON), to name a few examples. According to some embodiments, first gate oxide layer 118 is thicker than second gate oxide layer 122. For example, first gate oxide layer 118 may be at least 1 nm, at least 2 nm, or at least 3 nm thicker than second gate oxide layer 122. First gate oxide layer may have a thickness between about 3 nm and about 5 nm.

According to some embodiments, second gate oxide layer 122 may be formed from a portion of the semiconductor material of nanoribbons 106 such that the resulting nanoribbons 106 have a lower thickness at their midpoint compared to a thickness of nanoribbons 104 at their midpoint. As used herein, the midpoint of a nanoribbon refers to the midpoint location along the length of the nanoribbon (e.g. along the first direction). In some embodiments, each of first gate oxide layer 118 and second gate oxide layer 122 are formed via thermal oxidation, and thus do not form on (or form very little on) the sidewall surfaces of inner spacers 116 and spacer structures 114. In one such example, nanoribbons 104 have a midpoint thickness that is 1 nm or more thicker than a midpoint of nanoribbons 106.

Figure 1B:
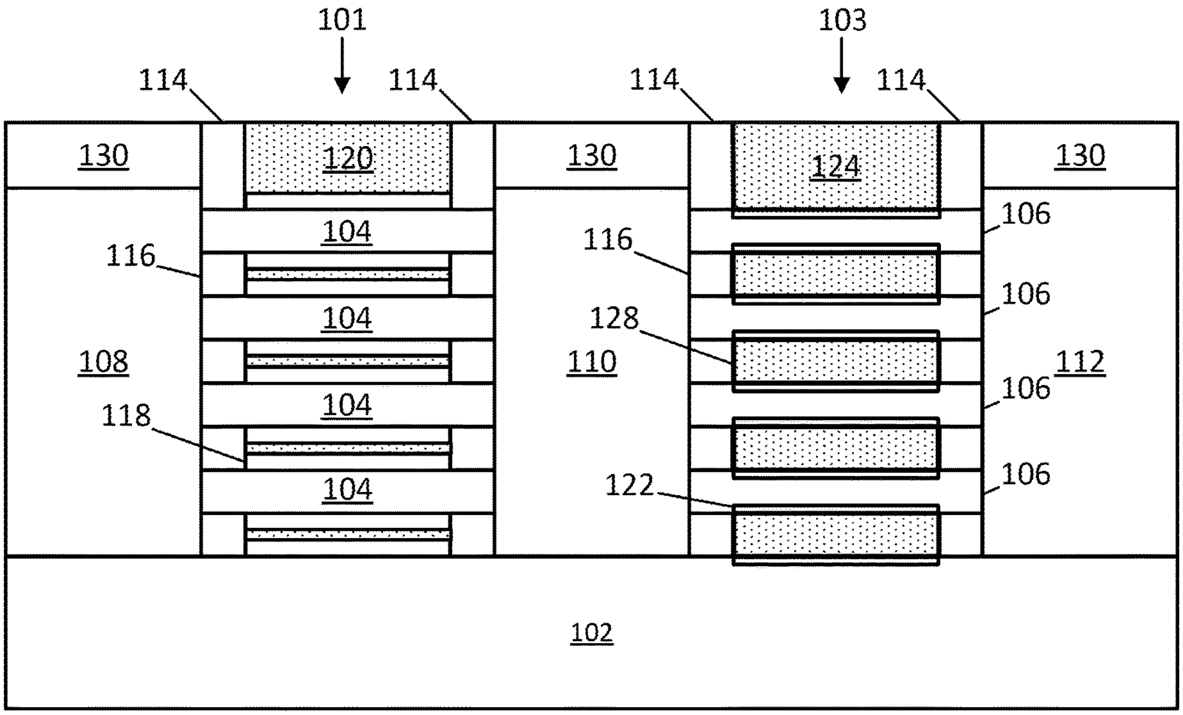
FIG. 1B is a cross-sectional view of another pair of semiconductor devices that illustrates different gate oxide thickness between the devices, in accordance with another embodiment of the present disclosure.

According to some embodiments, the first gate structure has a first gate dielectric structure between nanoribbons 104 and first gate electrode 120, where the first gate dielectric structure includes first gate oxide layer 118 and a first high-k dielectric layer 126 on first gate oxide layer 118, and the second gate structure has a second gate dielectric structure between nanoribbons 106 and second gate electrode 124, where the second gate dielectric structure includes second gate oxide layer 122 and a second high-k dielectric layer 128 on second gate oxide layer 122. First high-k dielectric layer 126 and second high-k dielectric layer 128 may include any suitable high-k material having a dielectric constant greater than 6.5. Some example high-k materials include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. According to some embodiments, first high-k dielectric layer 126 and second high-k dielectric layer 128 are formed at the same time and thus include the same material composition. Note that each of first high-k dielectric layer 126 and second high-k dielectric layer 128 may be present along sidewalls of inner spacers 116 and spacer structures 114. As seen in FIG. 1B, in some embodiments, only second high-k dielectric layer 128 is present around nanoribbons 106 and no high-k dielectric layer is formed around nanoribbons 104. This may be used in situations where spacing between nanoribbons 104 becomes too tight due to the presence of the thicker first gate oxide layer 118.

According to some embodiments, first and second gate electrodes 120/124 may include any sufficiently conductive material such as a metal, metal alloy, or doped polysilicon. According to some embodiments, the gate electrodes 120/124 may be interrupted between any other semiconductor devices by a gate cut structure. In some embodiments, the gate electrodes 120/124 include one or more work function metals around the corresponding nanoribbons. For example, a p-channel device may include a work function metal having titanium around the nanoribbons of the p-channel device. In another example, an n-channel device may include a work function metal having tungsten around nanoribbons of the n-channel device. In some embodiments, gate electrodes 120/124 each includes a fill metal or other conductive material around the work function metal(s) to provide the whole gate electrode structure.

A conductive contact 130 may be formed over each of source and drain regions 108/110/112 to provide electrical connections to each of source and drain regions 108/110/112. Conductive contact 130 can include any suitable conductive material, such as tungsten, copper, cobalt, titanium, ruthenium, or tantalum.

Fabrication Methodology

Figure 2A:
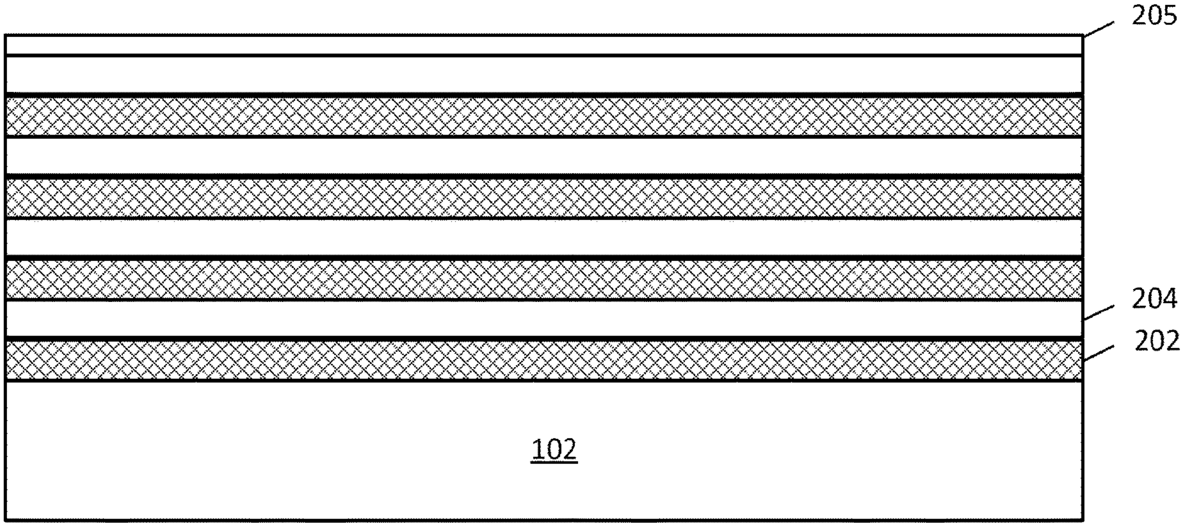
FIGS. 2A-2N are cross-sectional views that illustrate various stages in an example process for forming semiconductor devices with different gate oxide thicknesses, in accordance with some embodiments of the present disclosure.
Figure 2B:
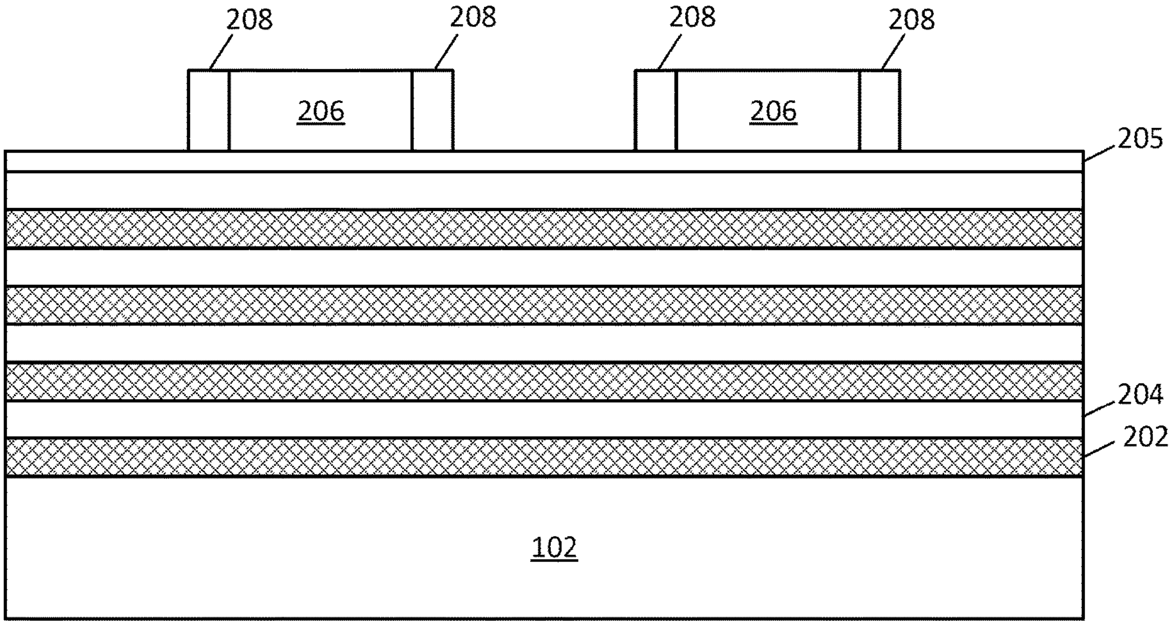
Figure 2C:
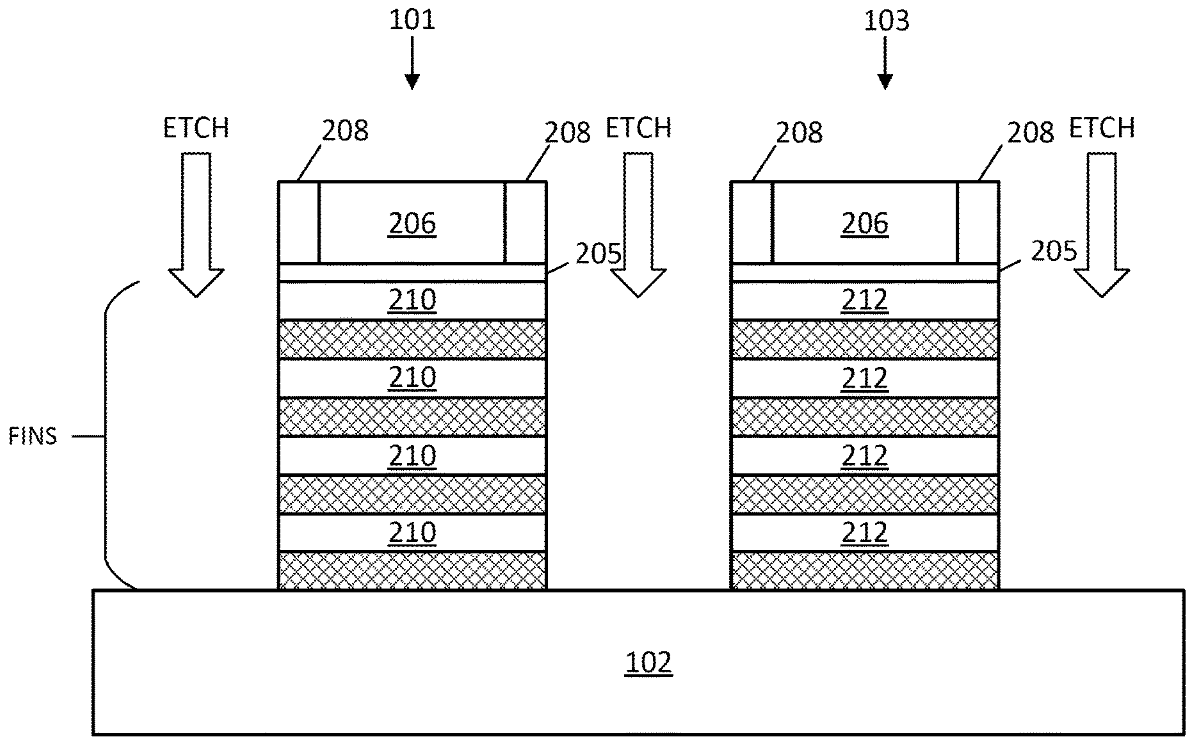
Figure 2D:
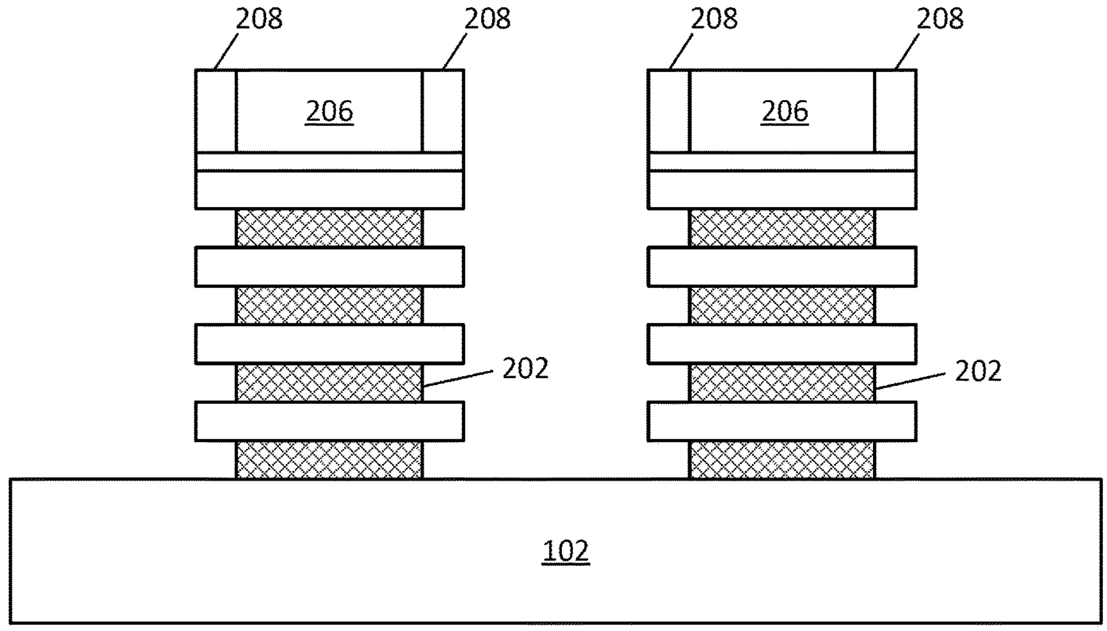
Figure 2E:
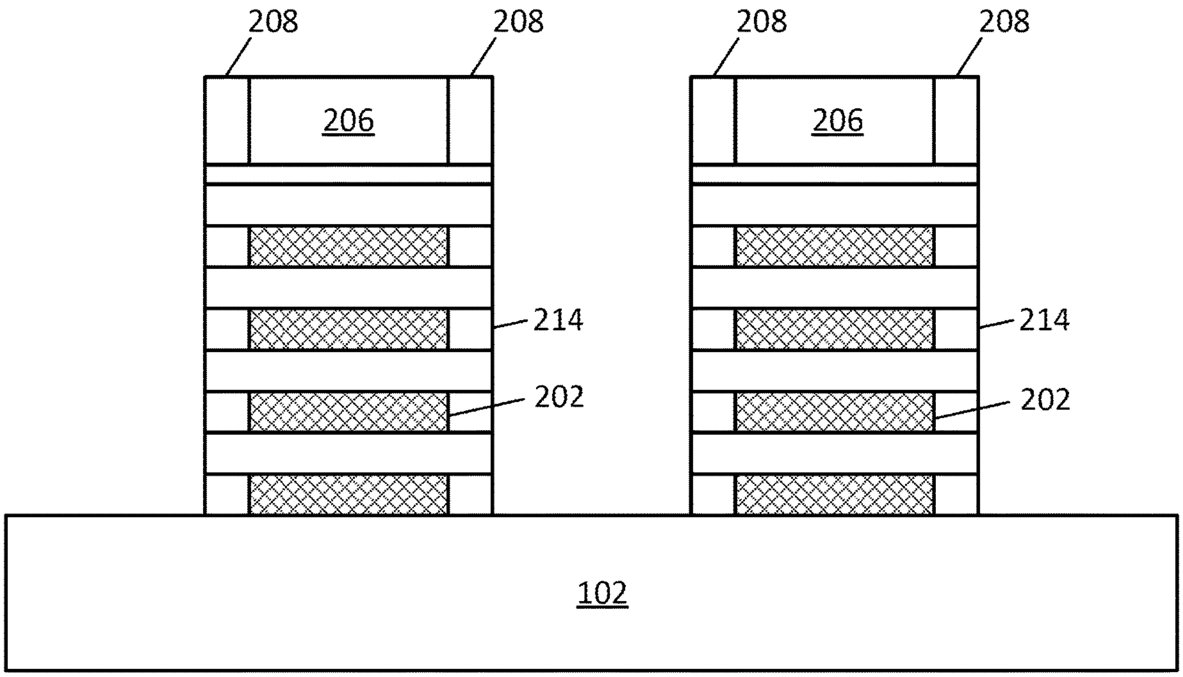
Figure 2F:
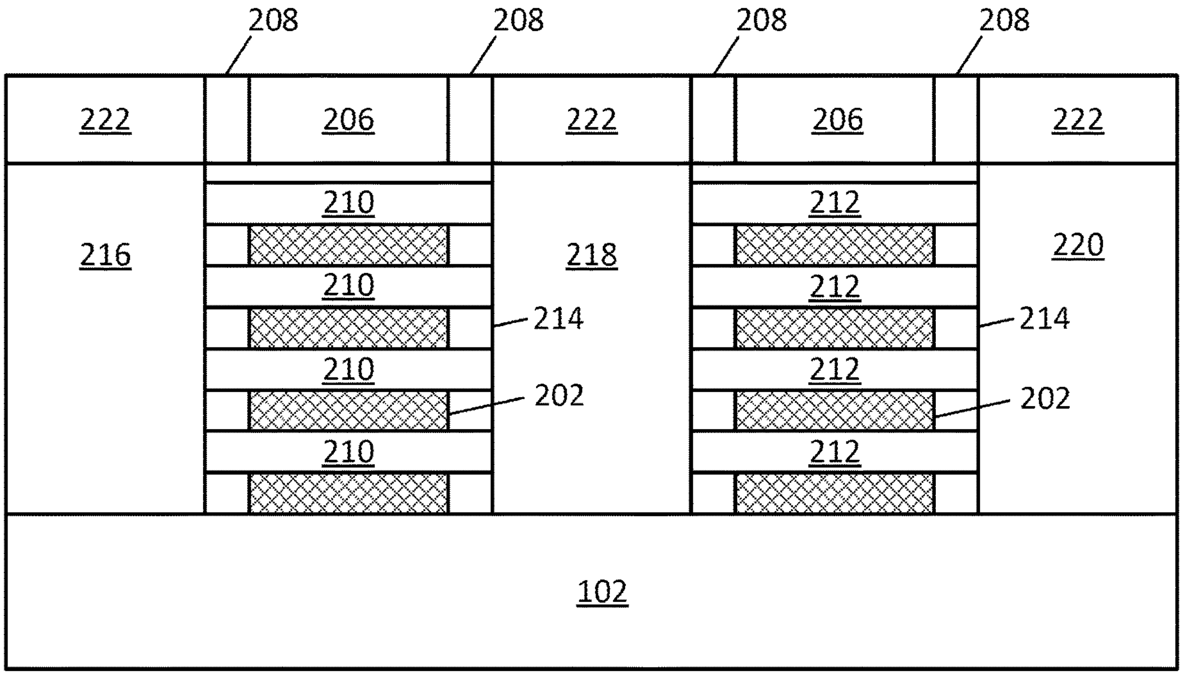
Figure 2G:
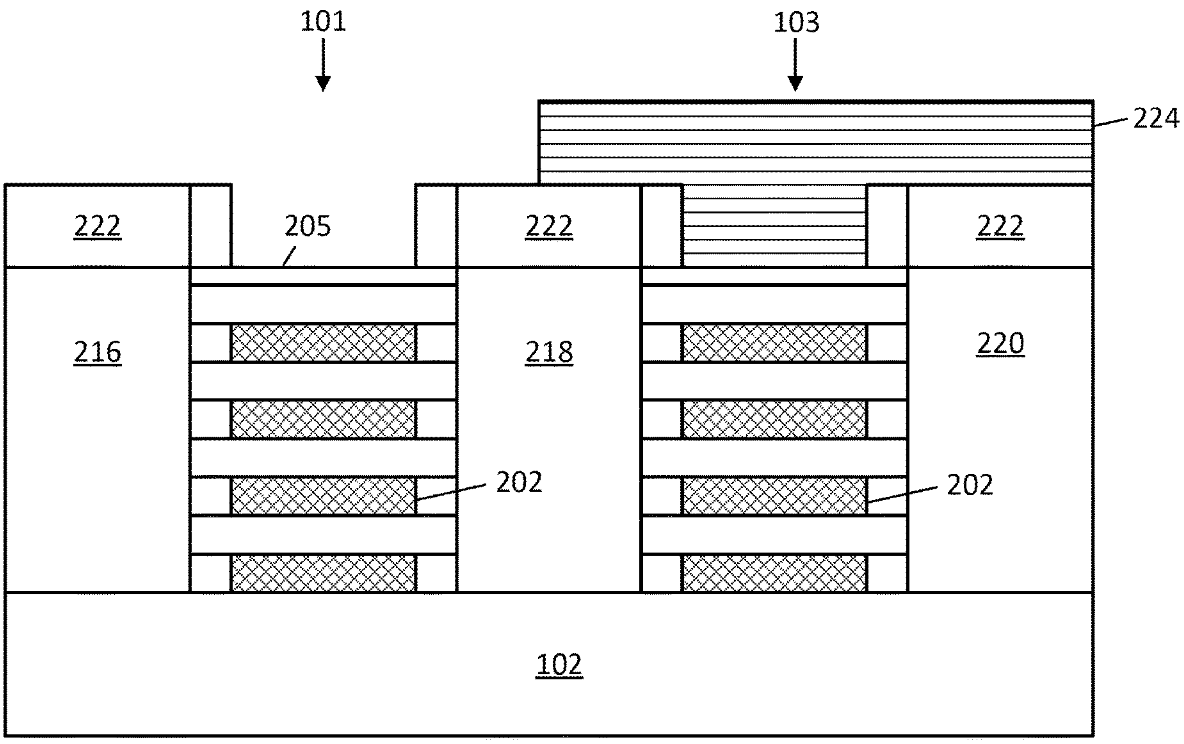
Figure 2H:
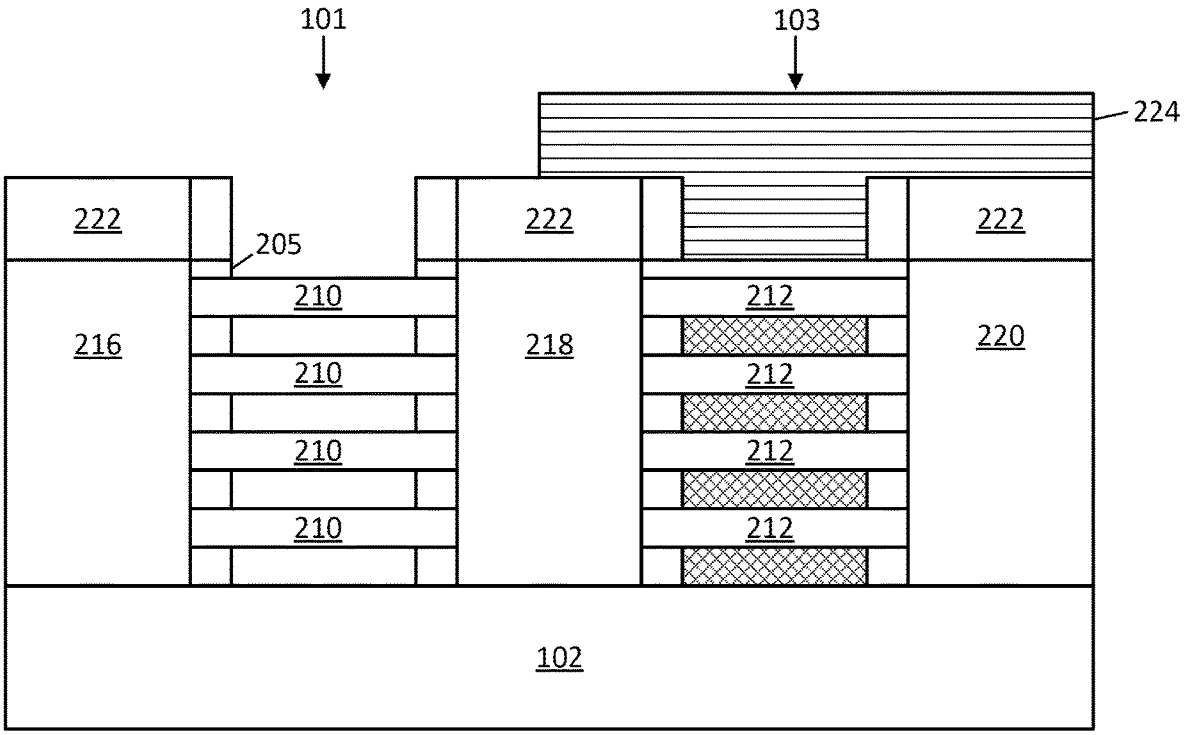
Figure 2I:
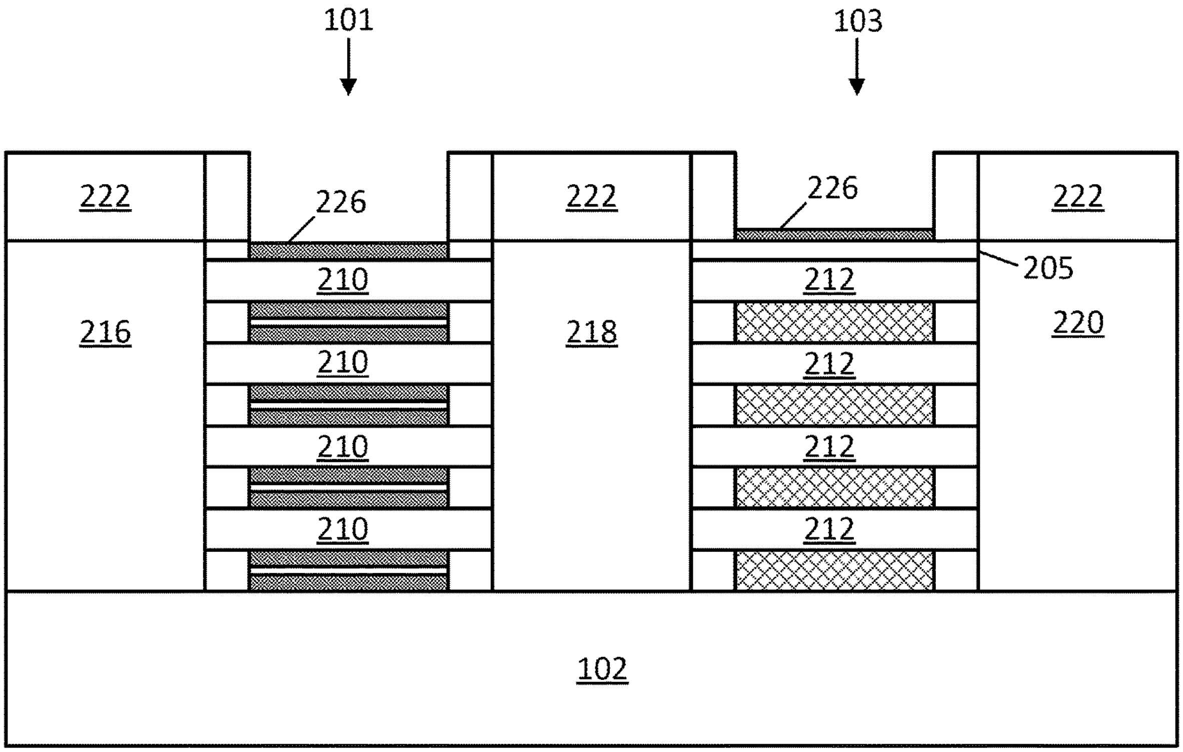
Figure 2J:
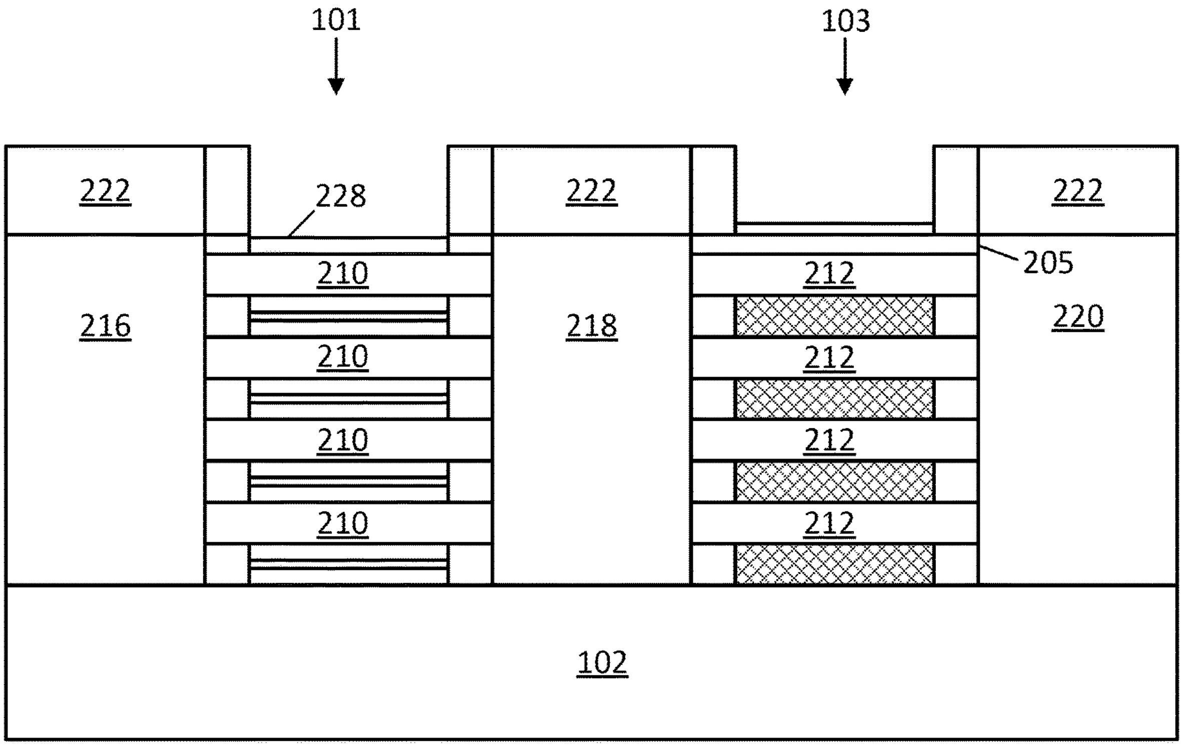
Figure 2K:
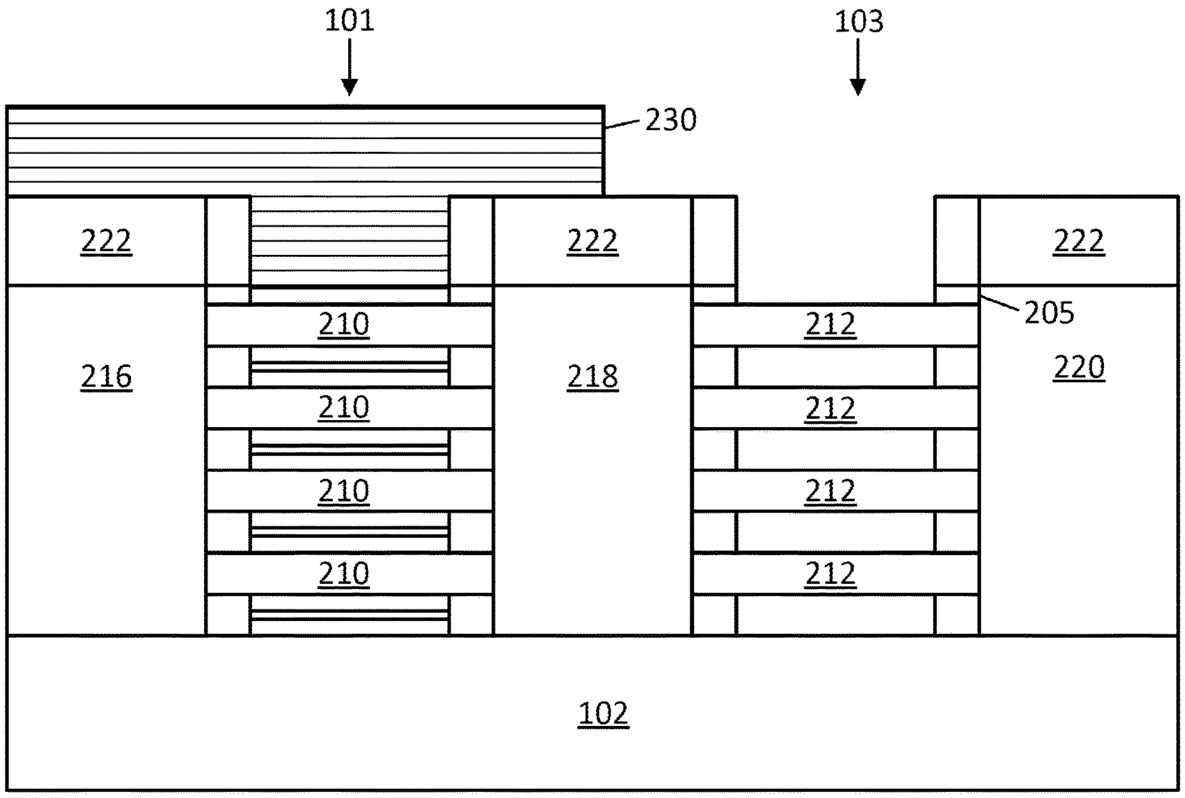
Figure 2L:
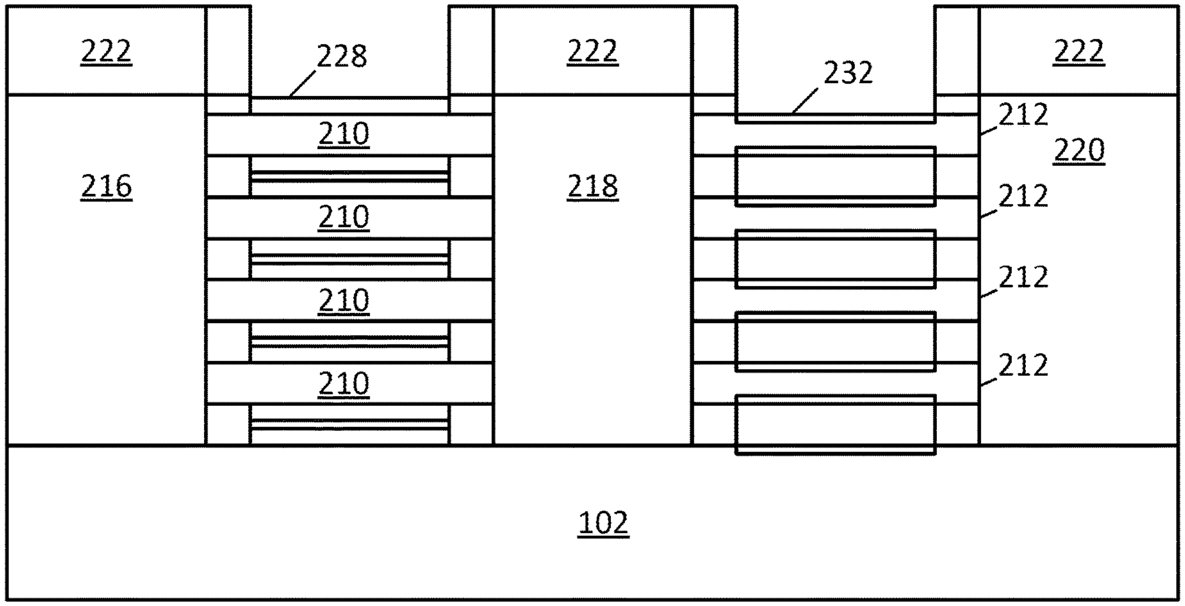
Figure 2M:
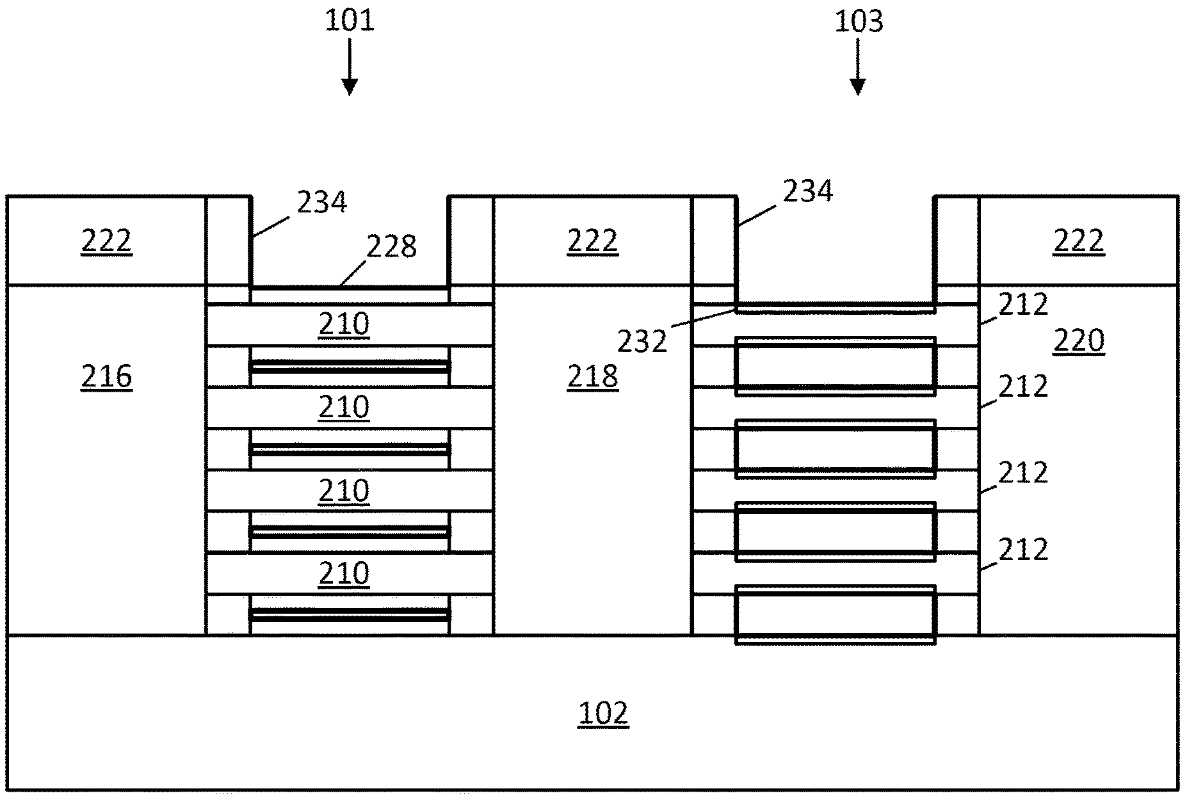
Figure 2N:
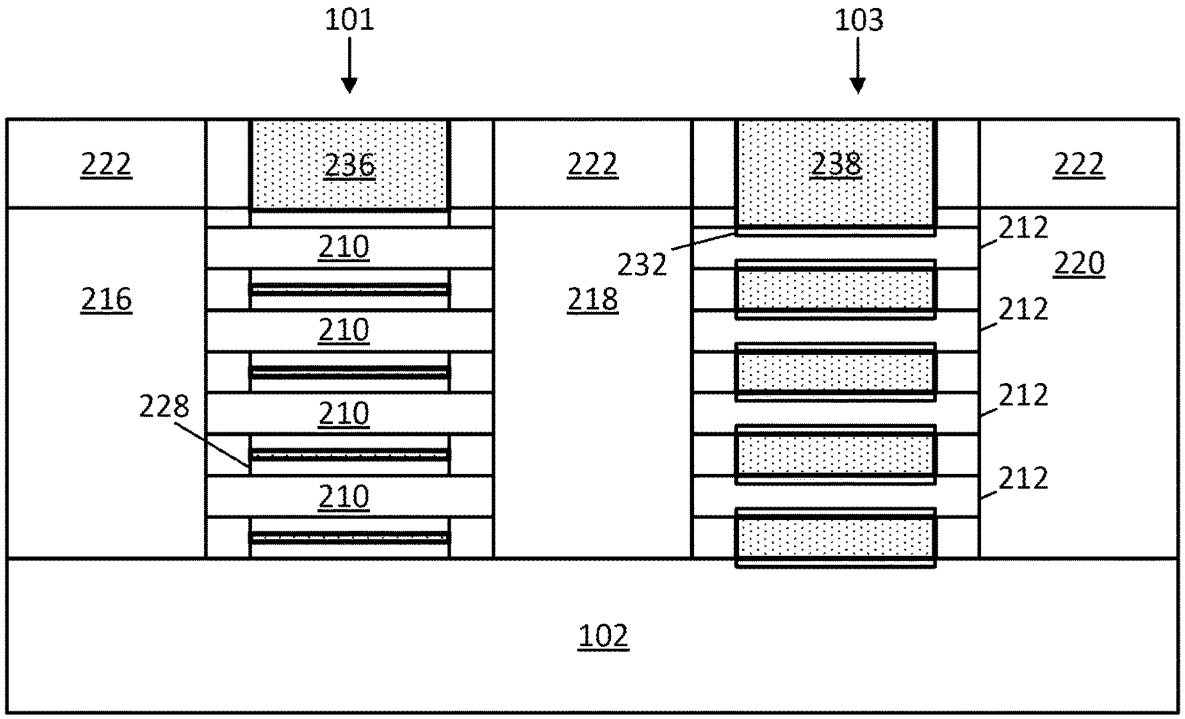

FIGS. 2A-2N include cross-sectional views that collectively illustrate an example process for forming an integrated circuit configured with semiconductor devices with different gate oxide thicknesses, according to some embodiments. Each figure shows an example structure that results from the process flow up to that point in time, so the depicted structure evolves as the process flow continues, culminating in the structure shown in FIG. 2N, which is similar to the structure shown in FIG. 1A. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

FIG. 2A illustrates substrate 102 having a series of material layers formed over the substrate, according to an embodiment of the present disclosure. Alternating material layers may be deposited over substrate 102 including sacrificial layers 202 alternating with semiconductor layers 204. Any number of alternating semiconductor layers 204 and sacrificial layers 202 may be deposited over substrate 102. It should be noted that the cross-sectional illustrated in FIG. 2A is taken along the length of a fin structure (e.g., along a first direction) formed from the multiple layers and extending up above the surface of substrate 102.

According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. Semiconductor layers 204 may be doped with either n-type dopants (to produce a p-channel transistor) or p-type dopants (to produce an n-channel transistor).

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm). The thickness of each of semiconductor layers 204 may be about the same as the thickness of each sacrificial layer 202 (e.g., about 5-20 nm). Each of sacrificial layers 202 and semiconductor layers 204 may be deposited using any known material deposition technique, such as chemical vapor deposition (CVD), plasma-enhanced chemical vapor deposition (PECVD), physical vapor deposition (PVD), or atomic layer deposition (ALD).

According to some embodiments, a dummy oxide layer 205 may be formed over the fin structure of alternating semiconductor layers 204 and sacrificial layers 202. Dummy oxide layer 205 may be silicon dioxide and may be deposited via CVD or ALD.

FIG. 2B illustrates a cross-sectional view of the structure shown in FIG. 2A following the formation of sacrificial gate structures 206 and sidewall spacers 208 over dummy oxide layer 205 and the alternating layer structure of the fin, according to an embodiment. Sacrificial gate structures 206 may run in an orthogonal direction (e.g., along a second direction) to the length of the fin and may include any material that can be safely removed later in the process without etching or otherwise damaging any portions of the fin or of spacer structures 208. In some embodiments, sacrificial gate structures 206 include polysilicon. Spacer structures 208 may be formed using an etch-back process where spacer material is deposited everywhere and then anisotropically etched to leave the material only on sidewalls of structures including sacrificial gate structures 206. Spacer structures 208 may include a dielectric material, such as silicon nitride, silicon oxy-nitride, or any formulation of those layers incorporating carbon or boron dopants. Sacrificial gate structures 206 together with spacer structures 208 define portions of the fin that will be used to form first and second semiconductor devices, as discussed further herein.

FIG. 2C illustrates a cross-sectional view of the structure shown in FIG. 2B following the removal of the exposed fin structure not under sacrificial gate structures 206 and sidewall spacers 208, according to an embodiment of the present disclosure. According to some embodiments, the various alternating material layers are etched together using an anisotropic RIE process. In some embodiments, some undercutting occurs along the edges of the resulting fin structures beneath spacer structures 208 such that the length of a given fin structure is not exactly the same as a sum of the widths of spacer structures 208 and a width of sacrificial gate structure 206. The RIE process may also etch into substrate 102 thus recessing portions of substrate 102 on either side of any of the fin structures. According to some embodiments, a first fin structure of first semiconductor device 101 includes first semiconductor layers 210 while a second fin structure of second semiconductor device 103 includes second semiconductor layers 212.

FIG. 2D illustrates a cross-sectional view of the structure shown in FIG. 2C following the removal of portions of sacrificial layers 202, according to an embodiment of the present disclosure. An isotropic etching process may be used to recess the exposed ends of each sacrificial layers 202.

FIG. 2E illustrates a cross-sectional view of the structure shown in FIG. 2D following the formation of internal spacers 214, according to an embodiment of the present disclosure. Internal spacers 214 may have a material composition that is similar to or the exact same as spacer structures 208. Accordingly, internal spacers 214 may be any suitable dielectric material that exhibits high etch selectively to semiconductor materials such as silicon and/or silicon germanium. Internal spacers 214 may be conformally deposited over the sides of the fin structure using a CVD process like ALD and then etched back using an isotropic etching process to expose the ends of first semiconductor layers 210 and second semiconductor layers 212.

FIG. 2F illustrates a cross-sectional view of the structure shown in FIG. 2E following the formation of source and drain regions, according to an embodiment of the present disclosure. According to an embodiment, a source region 216 is formed at first ends of first semiconductor layers 210 and a drain region 218 is formed between second ends of first semiconductor layers 210 and first ends of second semiconductor layers 212. Another source region 220 may be formed at second ends of second semiconductor layers 212. As noted above, any of source and drain regions 216/218/220 can act as either a source or drain depending on the application. In some examples, source and drain regions 216/218/220 are epitaxially grown from the ends of semiconductor layers 210 and 212. Any semiconductor materials suitable for source and drain regions 216/218/220 can be used (e.g., group IV and group III-V semiconductor materials). Source and drain regions 216/218/220 may include multiple layers such as liners and capping layers to improve contact resistance. In any such cases, the composition and doping of source and drain regions 216/218/220 may be the same or different, depending on the polarity of the transistors. Any number of source and drain configurations and materials can be used.

A dielectric cap layer 222 may be formed over each of source and drain regions 216/218/220, according to some embodiments. Dielectric cap layer 222 allows for a planarized structure, such that the top surface of sacrificial gate structure 206 is co-planar with the top surface of dielectric cap layer 222. Dielectric cap layer 222 may be any suitable dielectric material, such as silicon oxide, aluminum oxide, silicon nitride, or silicon oxycarbonitride.

FIG. 2G illustrates a cross-sectional view of the structure shown in FIG. 2F following the removal of sacrificial gate structures 206 and the formation of a first mask structure 224 over second semiconductor device 103, while exposing first semiconductor device 101, according to an embodiment of the present disclosure. Sacrificial gate structures 206 may be removed using any suitable isotropic etching process to selectively remove the material of sacrificial gate structures 206 without damaging other structures within the gate trenches. First mask structure 224 may include any number of dielectric and/or hard mask layers. In some examples, first mask structure 224 at least includes carbon hard mask (CHM).

FIG. 2H illustrates a cross-sectional view of the structure shown in FIG. 2G following the removal of dummy oxide layer 205 from around the fin structure of first semiconductor device 101, and the removal of sacrificial layers 202 from first semiconductor device 101, according to an embodiment of the present disclosure. Dummy oxide layer 205 may be removed from around the fin structure using any suitable isotropic etching process to remove, for example, silicon dioxide. Following the removal of dummy oxide layer 205, the exposed sacrificial layers 202 may also be removed using a selective isotropic etching process that removes the material of sacrificial layers 202 but does not remove (or removes very little of) first semiconductor layers 210. At this point, the suspended first semiconductor layers 210 form nanoribbons or nanowires (or similar semiconductor bodies) that extend between source and drain regions 216/218. In some embodiments, first mask structure 224 may be removed following the removal of dummy oxide layer 205 and before the removal of sacrificial layers 202.

FIG. 2I illustrates a cross-sectional view of the structure shown in FIG. 2H following the removal of first mask structure 224 and the formation of a crystalline semiconductor layer 226 on first semiconductor layers 210, according to an embodiment of the present disclosure. Crystalline semiconductor layer 226 may be a layer of crystalline silicon that forms primarily on the exposed silicon surfaces of first semiconductor layers 210. Smaller portions of crystalline semiconductor layer 226 may form on dummy oxide layer 205 of second semiconductor device 103. According to some embodiments, crystalline semiconductor layer 226 may be deposited via CVD. Crystalline semiconductor layer 226 may be deposited to a final thickness between about 1.5 nm and about 2.5 nm on first semiconductor layers 210.

FIG. 2J illustrates a cross-sectional view of the structure shown in FIG. 2I following the oxidation of crystalline semiconductor layer 226 and formation of first gate oxide layer 228, according to an embodiment of the present disclosure. A thermal oxidation process may be performed to convert crystalline semiconductor layer 226 into an oxide of the semiconductor material used. For example, a silicon crystalline semiconductor layer 226 may be converted into silicon dioxide. Since first gate oxide layer 228 is primarily formed from oxidation of crystalline semiconductor layer 226, little to none of first semiconductor layers 210 are consumed to form first gate oxide layer 228, thus substantially maintaining the thickness of first semiconductor layers 210. Other example dielectric materials for first gate oxide layer 228 include silicon oxycarbonitride (SiOCN), silicon oxycarbide (SiOC), or silicon oxynitride (SiON). First gate oxide layer 228 may have a final thickness around first semiconductor layers 210 between about 3 nm and about 5 nm. Some portions of crystalline semiconductor layer 226 may also be oxidized over dummy oxide layer 205 of second semiconductor device 103, leading to a thicker oxide around the nanoribbons or nanowires of second semiconductor device 103.

FIG. 2K illustrates a cross-sectional view of the structure shown in FIG. 2J following the formation of a second mask structure 230 over first semiconductor device 101, while exposing second semiconductor device 103, according to an embodiment of the present disclosure. Second mask structure 230 may include any number of dielectric and/or hard mask layers. In some examples, second mask structure 230 at least includes carbon hard mask (CHM).

Following the formation of second mask structure 230, dummy oxide layer 205 from around the fin structure of second semiconductor device 103 is removed, and sacrificial layers 202 from second semiconductor device 103 are removed, according to an embodiment of the present disclosure. Dummy oxide layer 205 may be removed from around the fin using any suitable isotropic etching process to remove, for example, silicon dioxide. Following the removal of dummy oxide layer 205, the exposed sacrificial layers 202 may also be removed using a selective isotropic etching process that removes the material of sacrificial layers 202 but does not remove (or removes very little of) second semiconductor layers 212. At this point, the suspended second semiconductor layers 212 form nanoribbons or nanowires (or similar semiconductor bodies) that extend between source and drain regions 218/220. In some embodiments, second mask structure 230 may be removed following the removal of dummy oxide layer 205 and before the removal of sacrificial layers 202 from second semiconductor device 103.

FIG. 2L illustrates a cross-sectional view of the structure shown in FIG. 2K following the formation of a second gate oxide layer 232 around second semiconductor layers 212, according to an embodiment of the present disclosure. A thermal oxidation process may be performed to form an oxide of the semiconductor material of second semiconductor layers 212 on all exposed surfaces of second semiconductor layers 212 within the gate trench. For example, a portion of silicon semiconductor layers 212 may be converted into silicon dioxide. Since second gate oxide layer 232 is formed from oxidation of the semiconductor material of second semiconductor layers 212, the thickness of second semiconductor layers 212 is decreased where second gate oxide layer 232 is formed. For example, the thickness at a midpoint of first semiconductor layers 210 is thicker by 1 nm or more than a thickness at a midpoint of second semiconductor layers 212. In one such example, the midpoint thickness of first semiconductor layers 210 is about 12 angstroms to about 20 angstroms thicker than a midpoint thickness of second semiconductor layers 212. Other example dielectric materials for second gate oxide layer 232 include silicon oxycarbonitride (SiOCN), silicon oxycarbide (SiOC), or silicon oxynitride (SiON). According to some embodiments, second gate oxide layer 232 has a lower thickness compared to first gate oxide layer 228. For example, second gate oxide layer 232 has a thickness that is at least 1 nm, at least 2 nm, or at least 3 nm lower than a thickness of first gate oxide layer 228.

FIG. 2M illustrates a cross-sectional view of the structure shown in FIG. 2L following the formation of a high-k dielectric layer 234 over at least first gate oxide layer 228 and second gate oxide layer 232, according to an embodiment of the present disclosure. High-k dielectric layer 234 may also be formed on any exposed surfaces within the gate trenches of both semiconductor devices 101 and 103. According to some embodiments, high-k dielectric layer 234 includes hafnium oxide, but it may also be any suitable high-k dielectric material. In some embodiments, high-k dielectric layer 234 represents any number of high-k material layers. The same high-k dielectric layer 234 may be formed over first gate oxide layer 228 and second gate oxide layer 232. In some other examples, the high-k dielectric materials used over first gate oxide layer 228 are different than the high-k dielectric materials used over second gate oxide layer 232.

FIG. 2N illustrates a cross-sectional view of the structure shown in FIG. 2M following the formation of a first gate electrode 236 over first gate oxide layer 228 and a second gate electrode 238 over second gate electrode 238, according to an embodiment of the present disclosure. Each of first gate electrode 236 and second gate electrode 238 may include doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrodes may include, for instance, one or more workfunction layers, resistance-reducing layers, and/or barrier layers. In one example, the workfunction layers include, for example, p-type workfunction materials (e.g., titanium nitride) or n-type workfunction materials (e.g., titanium aluminum carbide).

FIGS. 3A-3H include cross-sectional views that collectively illustrate another example process for forming an integrated circuit configured with semiconductor devices with different gate oxide thicknesses starting from the structure shown in FIG. 2J, according to some embodiments. Each figure shows an example structure that results from the process flow up to that point in time, so the depicted structure evolves as the process flow continues, culminating in the structure shown in FIG. 3H, which is similar to the structure shown in FIG. 1B. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 3A:
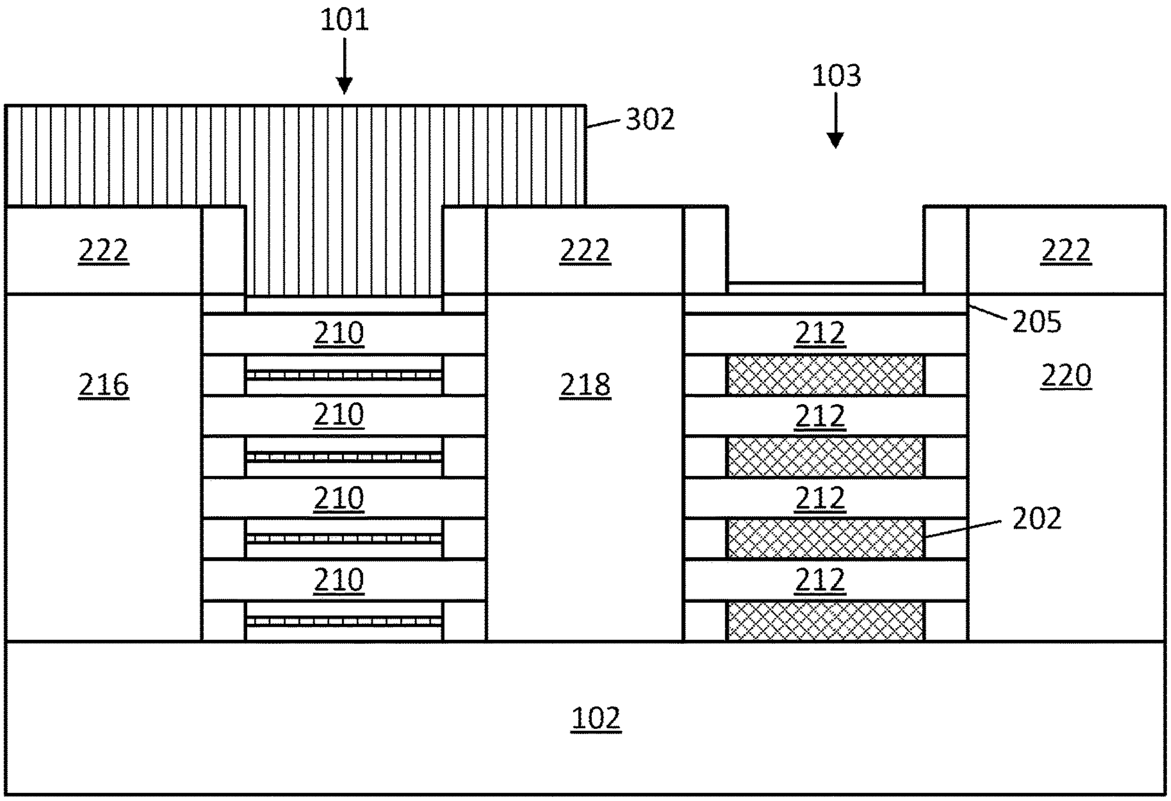
FIGS. 3A-3H are cross-sectional views that illustrate various stages in another example process for forming semiconductor devices with different gate oxide thicknesses, in accordance with some embodiments of the present disclosure.

FIG. 3A illustrates a cross-sectional view of the structure shown in FIG. 2J following the formation of a sacrificial material 302 over semiconductor device 101 while leaving semiconductor device 103 exposed, according to an embodiment of the present disclosure. According to some embodiments, sacrificial material 302 is a hard mask material that can withstand high temperatures during a thermal oxidation process. In one example, sacrificial material 302 includes titanium nitride.

Figure 3B:
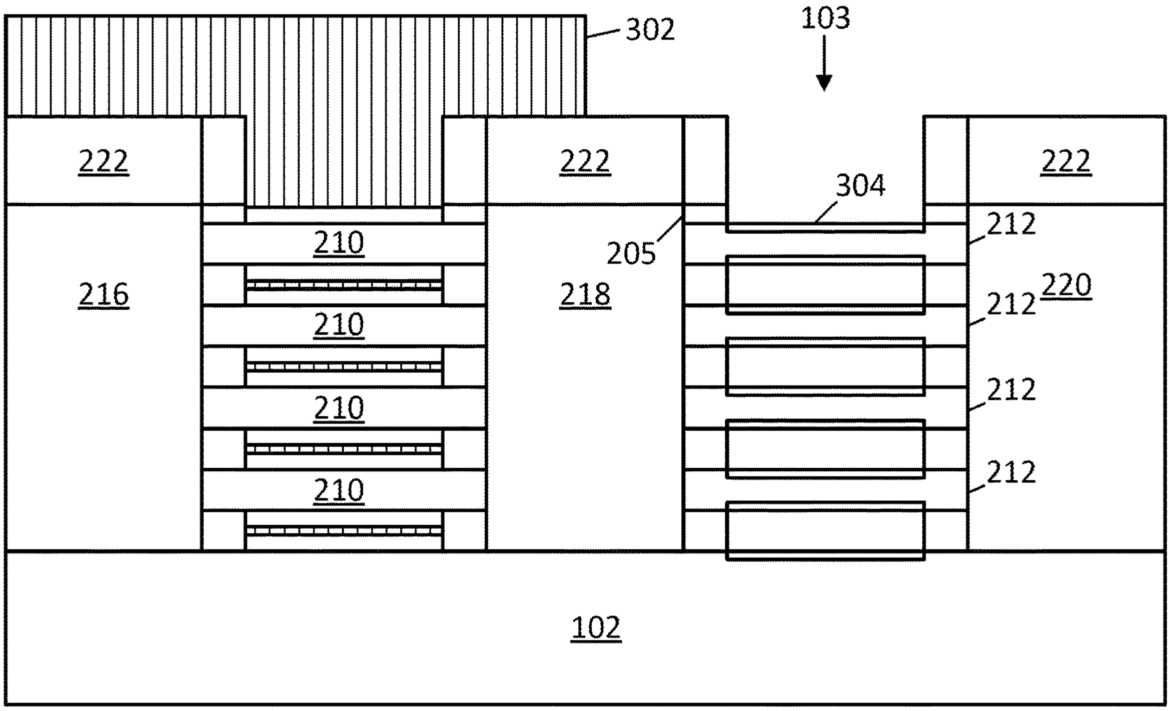

FIG. 3B illustrates a cross-sectional view of the structure shown in FIG. 3A following the removal of dummy oxide layer 205 and sacrificial layers 202 from second semiconductor device 103, according to an embodiment of the present disclosure. Additionally, a second gate oxide layer 304 is formed around the exposed second semiconductor layers 212 of second semiconductor device 103.

Dummy oxide layer 205 may be removed from around the fin structure using any suitable isotropic etching process to remove, for example, silicon dioxide. Following the removal of dummy oxide layer 205, the exposed sacrificial layers 202 may also be removed using a selective isotropic etching process that removes the material of sacrificial layers 202 but does not remove (or removes very little of) second semiconductor layers 212. At this point, the suspended second semiconductor layers 212 form nanoribbons or nanowires that extend between source and drain regions 218/220.

A thermal oxidation process may be performed to form an oxide of the semiconductor material of second semiconductor layers 212 on all exposed surfaces of second semiconductor layers 212 within the gate trench. For example, a portion of silicon semiconductor layers 212 may be converted into silicon dioxide to form second gate oxide layer 304. As discussed above, the thickness of second semiconductor layers 212 is decreased where second gate oxide layer 304 is formed. According to some embodiments, sacrificial material 302 remains during the oxidation process used to form second gate oxide layer 304.

Figure 3C:
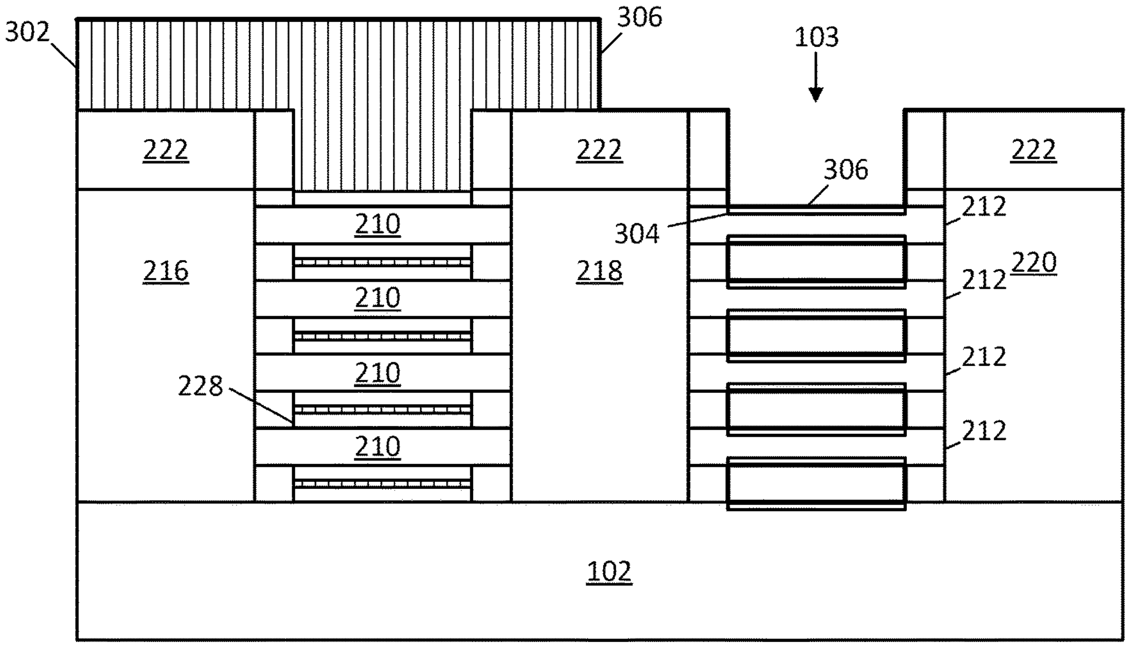

FIG. 3C illustrates a cross-sectional view of the structure shown in FIG. 3B following the formation of a high-k dielectric layer 306 over the structure, according to an embodiment of the present disclosure. High-k dielectric layer 306 may form on sacrificial material 302 and at least over second gate oxide layer 304 of second semiconductor device 103. According to some embodiments, high-k dielectric layer 306 includes hafnium oxide, but it may also be any suitable high-k dielectric material. In some embodiments, high-k dielectric layer 306 represents any number of high-k material layers. According to some embodiments, sacrificial material 302 blocks high-k dielectric material 306 from forming over first gate oxide layer 228.

Figure 3D:
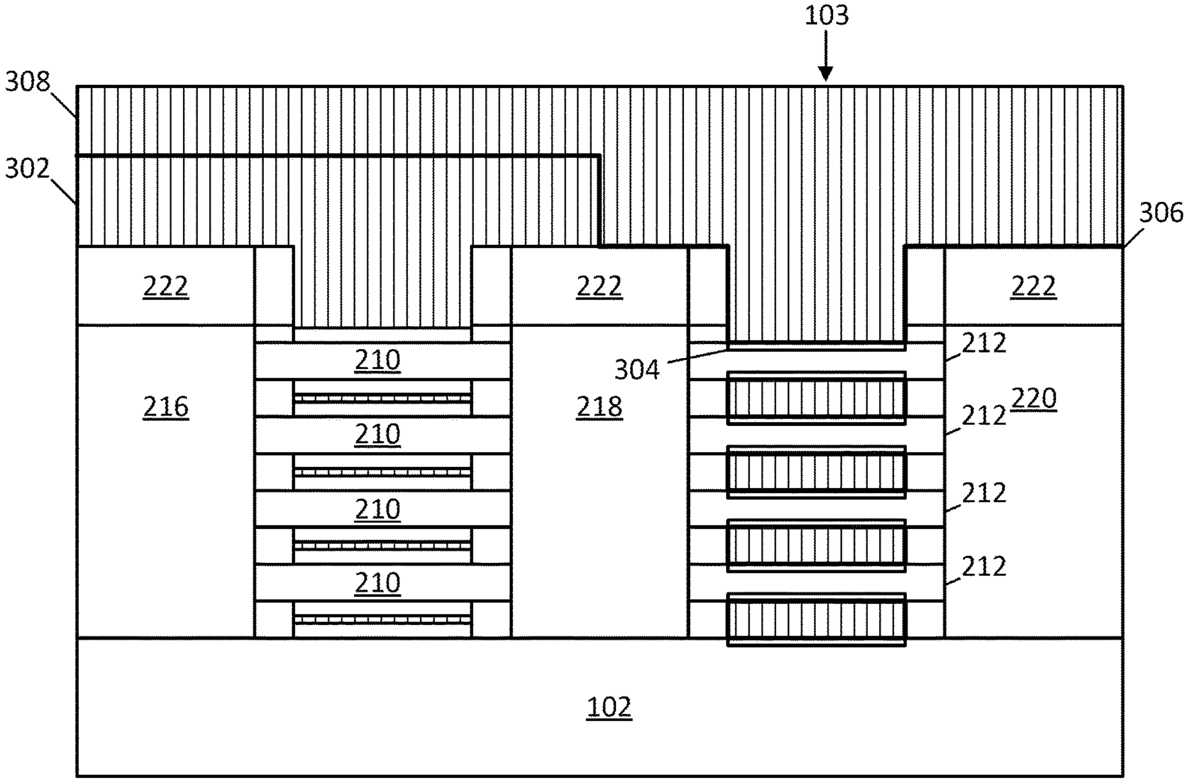

FIG. 3D illustrates a cross-sectional view of the structure shown in FIG. 3C following the formation of additional sacrificial material 308 on high-k dielectric layer 306, according to an embodiment of the present disclosure. Additional sacrificial material 308 may have the same material composition as sacrificial material 302. Accordingly, additional sacrificial material 308 may include titanium nitride. According to some embodiments, additional sacrificial material 308 is formed over both sacrificial material 302 and over second semiconductor layers 212 of second semiconductor device 103.

Figure 3E:
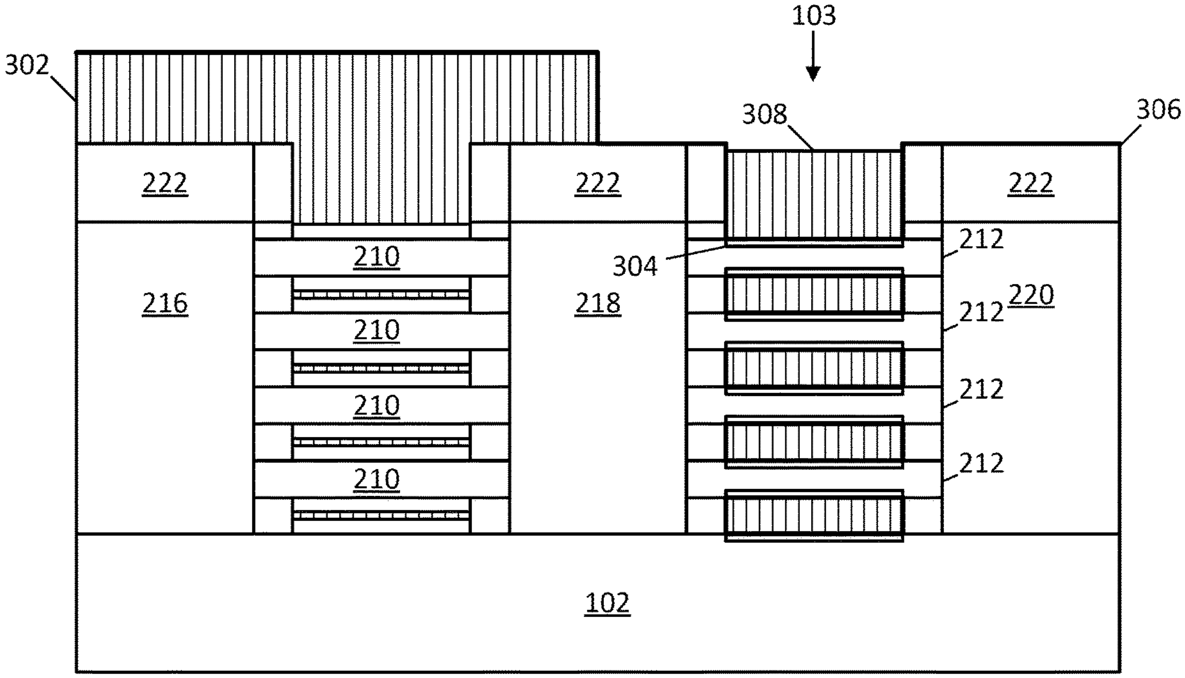

FIG. 3E illustrates a cross-sectional view of the structure shown in FIG. 3D following the recessing of additional sacrificial material 308, according to an embodiment of the present disclosure. Additional sacrificial material 308 may be recessed using an isotropic etching process to reveal high-k dielectric layer 306 over sacrificial material 302. However, additional sacrificial material 308 remains within the gate trench of second semiconductor device 103 to protect high-k dielectric layer 306 around second gate oxide layer 304.

Figure 3F:
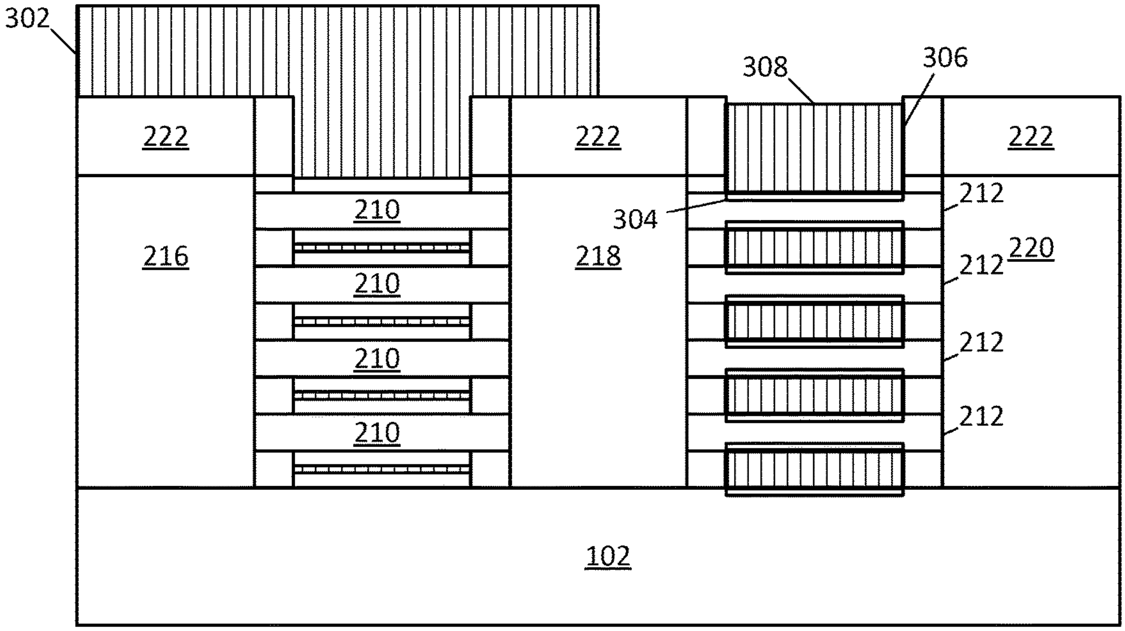

FIG. 3F illustrates a cross-sectional view of the structure shown in FIG. 3E following the removal of any exposed portions of high-k dielectric layer 306, according to an embodiment of the present disclosure. High-k dielectric layer 306 may be removed using any suitable isotropic etching process. According to some embodiments, high-k dielectric layer 306 is at least removed from over sacrificial material 302.

Figure 3G:
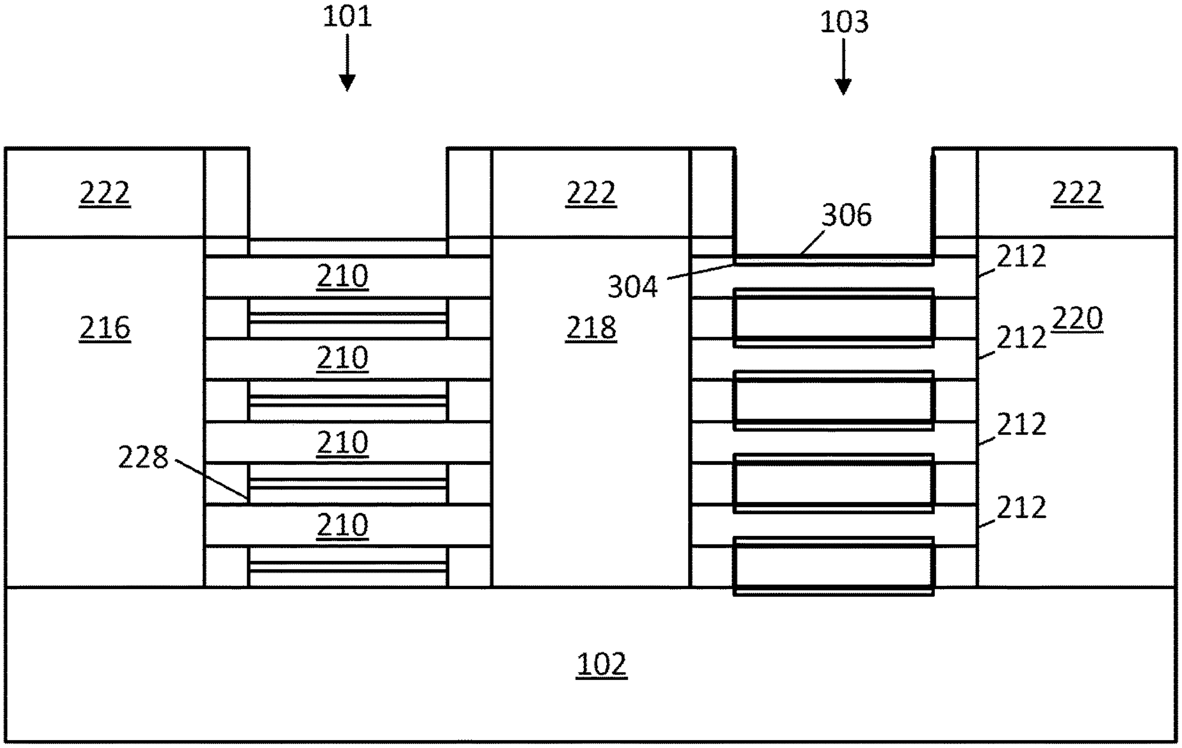

FIG. 3G illustrates a cross-sectional view of the structure shown in FIG. 3F following the removal of both sacrificial material 302 and additional sacrificial material 308, according to an embodiment of the present disclosure. Both materials may be removed using any suitable isotropic etching process to reveal the gate trenches of semiconductor devices 101 and 103. High-k dielectric layer 306 is present over second gate oxide layer 304, but not over first gate oxide layer 228, according to some embodiments.

Figure 3H:
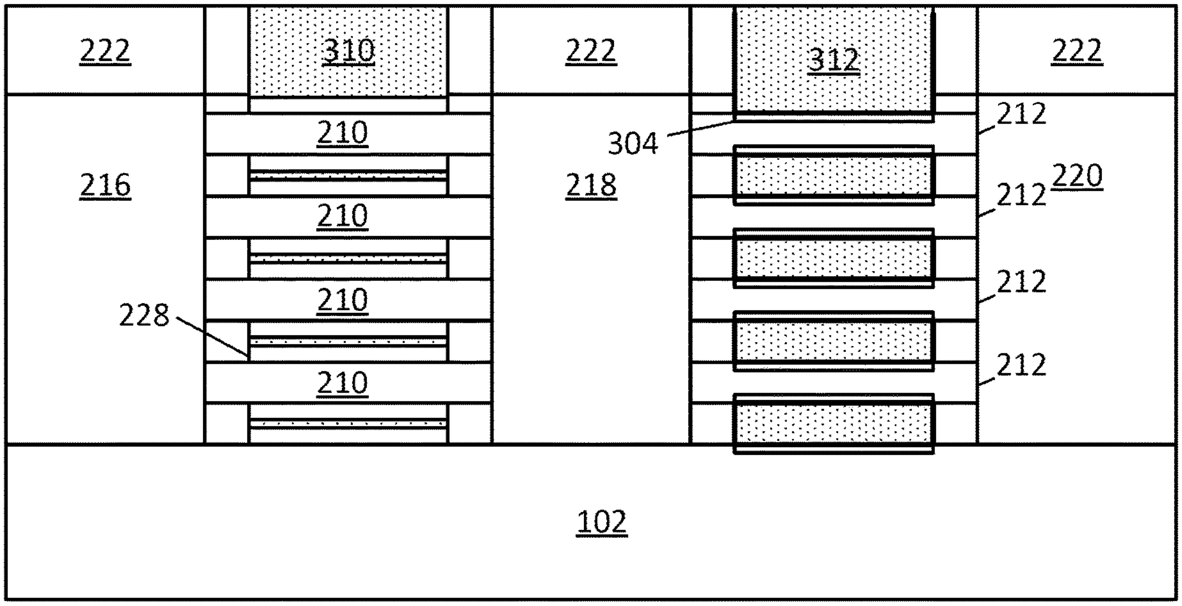

FIG. 3H illustrates a cross-sectional view of the structure shown in FIG. 3G following the formation of a first gate electrode 310 over first gate oxide layer 228 and a second gate electrode 312 over second gate oxide layer 304, according to an embodiment of the present disclosure. Each of first gate electrode 310 and second gate electrode 312 may include doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrodes may include, for instance, one or more workfunction layers, resistance-reducing layers, and/or barrier layers. In one example, the workfunction layers include, for example, p-type workfunction materials (e.g., titanium nitride) or n-type workfunction materials (e.g., titanium aluminum carbide).

Figure 4:
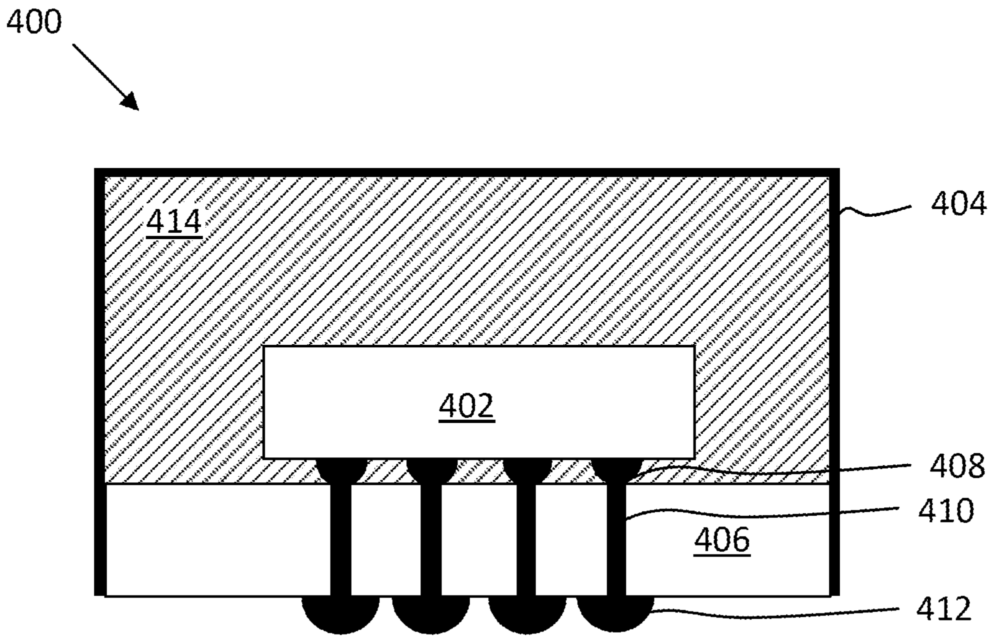
FIG. 4 illustrates a cross-sectional view of a chip package containing one or more semiconductor dies, in accordance with some embodiments of the present disclosure.

FIG. 4 illustrates an example embodiment of a chip package 400, in accordance with an embodiment of the present disclosure. As can be seen, chip package 400 includes one or more dies 402. One or more dies 402 may include at least one integrated circuit having semiconductor devices, such as any of the semiconductor devices disclosed herein. One or more dies 402 may include any other circuitry used to interface with other devices formed on the dies, or other devices connected to chip package 400, in some example configurations.

As can be further seen, chip package 400 includes a housing 404 that is bonded to a package substrate 406. The housing 404 may be any standard or proprietary housing, and may provide, for example, electromagnetic shielding and environmental protection for the components of chip package 400. The one or more dies 402 may be conductively coupled to a package substrate 406 using connections 408, which may be implemented with any number of standard or proprietary connection mechanisms, such as solder bumps, ball grid array (BGA), pins, or wire bonds, to name a few examples. Package substrate 406 may be any standard or proprietary package substrate, but in some cases includes a dielectric material having conductive pathways (e.g., including conductive vias and lines) extending through the dielectric material between the faces of package substrate 406, or between different locations on each face. In some embodiments, package substrate 406 may have a thickness less than 1 millimeter (e.g., between 0.1 millimeters and 0.5 millimeters), although any number of package geometries can be used. Additional conductive contacts 412 may be disposed at an opposite face of package substrate 406 for conductively contacting, for instance, a printed circuit board (PCB). One or more vias 410 extend through a thickness of package substrate 406 to provide conductive pathways between one or more of connections 408 to one or more of contacts 412. Vias 410 are illustrated as single straight columns through package substrate 406 for ease of illustration, although other configurations can be used (e.g., damascene, dual damascene, through-silicon via, or an interconnect structure that meanders through the thickness of substrate 406 to contact one or more intermediate locations therein). In still other embodiments, vias 410 are fabricated by multiple smaller stacked vias, or are staggered at different locations across package substrate 406. In the illustrated embodiment, contacts 412 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 412, to inhibit shorting.

In some embodiments, a mold material 414 may be disposed around the one or more dies 402 included within housing 404 (e.g., between dies 402 and package substrate 406 as an underfill material, as well as between dies 402 and housing 404 as an overfill material). Although the dimensions and qualities of the mold material 414 can vary from one embodiment to the next, in some embodiments, a thickness of mold material 414 is less than 1 millimeter. Example materials that may be used for mold material 414 include epoxy mold materials, as suitable. In some cases, the mold material 414 is thermally conductive, in addition to being electrically insulating.

Methodology

Figure 5:
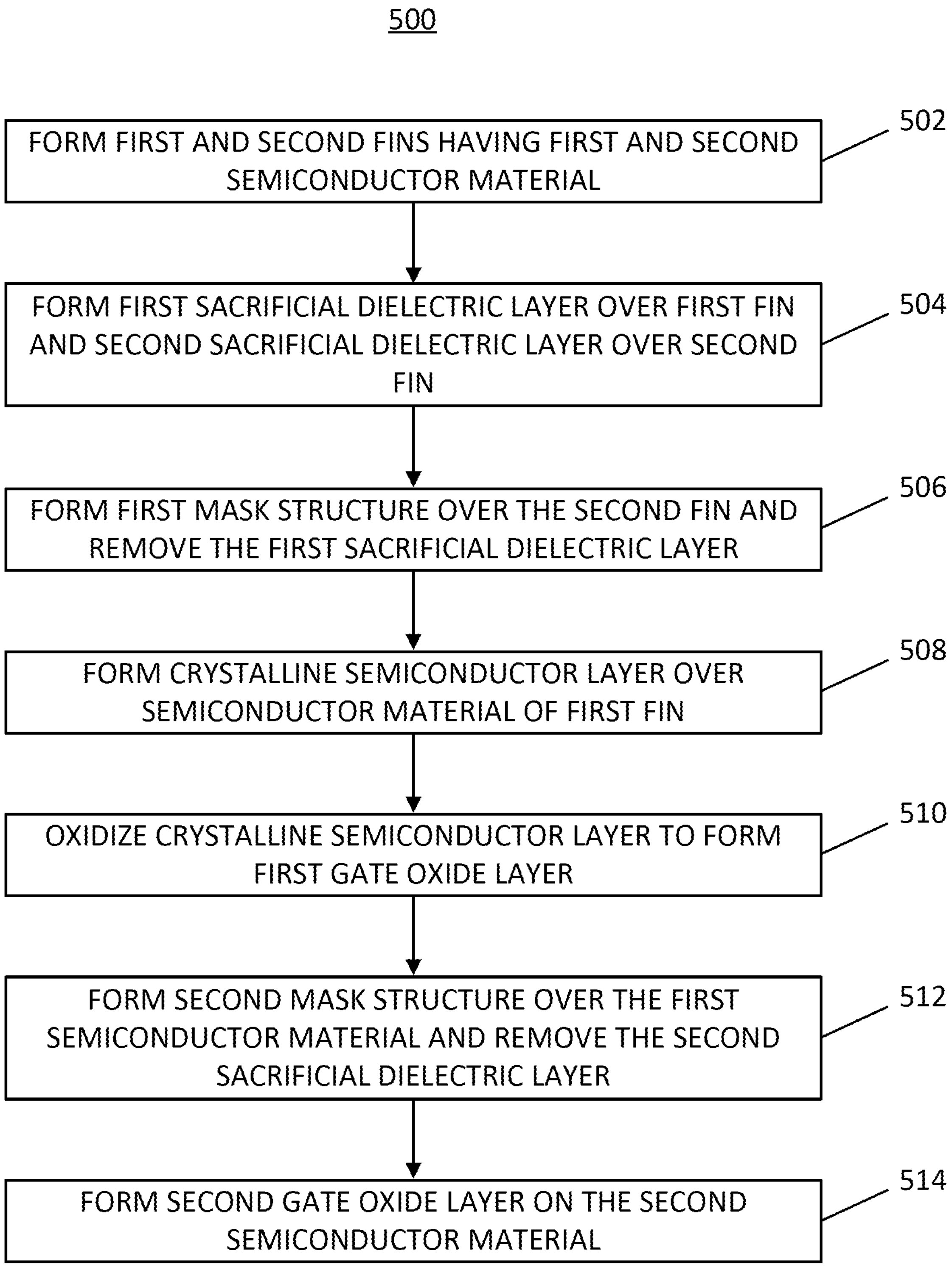
FIG. 5 is a flowchart of a fabrication process for semiconductor devices having different gate oxide thicknesses, in accordance with an embodiment of the present disclosure.

FIG. 5 is a flow chart of a method 500 for forming at least a portion of an integrated circuit, according to an embodiment. Various operations of method 500 may be illustrated in FIG. 2A-2N or 3A-3H. However, the correlation of the various operations of method 500 to the specific components illustrated in the aforementioned figures is not intended to imply any structural and/or use limitations. Rather, the aforementioned figures provide example embodiments of method 500. Other operations may be performed before, during, or after any of the operations of method 500. Some of the operations of method 500 may be performed in a different order than the illustrated order.

Method 500 begins with operation 502 where first and second multilayer fins are formed having alternating semiconductor and sacrificial layers. The sacrificial layers may include SiGe while the semiconductor layers may be Si, SiGe, Ge, InP, or GaAs, to name a few examples. The thickness of each of the sacrificial and semiconductor layers may be between about 5 nm and about 20 nm or between about 5 nm and about 10 nm. Each of the sacrificial and semiconductor layers may be deposited using any known material deposition technique, such as CVD, PECVD, PVD, or ALD. The first and second fins may be defined by patterning sacrificial gates and spacer structures that extend orthogonally over the fins, then etching around the sacrificial gates and spacer structures via an anisotropic etching process, such as RIE.

Method 500 continues with operation 504 where a first sacrificial dielectric layer is formed over the first fin and a second sacrificial dielectric layer is formed over the second fin. According to some embodiments, the first and second sacrificial dielectric layers are provided by a single dielectric layer formed over both fins. The sacrificial dielectric layers may include silicon dioxide and may be deposited using any suitable conformal deposition technique, such as CVD or ALD.

Method 500 continues with operation 506 where a first mask structure is formed over the second fin and the first sacrificial dielectric layer is removed from around the first fin. The first mask structure may include any number of dielectric and/or hard mask layers. In some examples, the first mask structure at least includes CHM. The first sacrificial dielectric layer may be removed using any suitable isotropic etching process.

Method 500 continues with operation 508 where a crystalline silicon layer is formed over semiconductor material of the first fin. According to some embodiments, the sacrificial layers of the first fin are removed using an isotropic etching process and the crystalline silicon layer is formed around the suspended semiconductor layers (e.g. nanoribbons) of the first fin. The crystalline semiconductor layer may be a layer of crystalline silicon that forms primarily on the exposed silicon surfaces of the semiconductor layers of the first fin. Smaller portions of the crystalline semiconductor layer may form on the second sacrificial dielectric layer of the second fin. According to some embodiments, the crystalline semiconductor layer may be deposited via CVD. The crystalline semiconductor layer may be deposited to a final thickness between about 1.5 nm and about 2.5 nm on the semiconductor layers of the first fin.

Method 500 continues with operation 510 where the crystalline semiconductor layer is oxidized to form a first gate oxide layer on the semiconductor layers (e.g. nanoribbons) of the first fin. A thermal oxidation process may be performed to convert the crystalline semiconductor layer into an oxide of the semiconductor material used. For example, a silicon crystalline semiconductor layer may be converted into silicon dioxide. Since the first gate oxide layer is primarily formed from oxidation of the crystalline semiconductor layer, little to none of the semiconductor layers (e.g. nanoribbons) of the first fin are consumed to form the first gate oxide layer, thus substantially maintaining the thickness of the semiconductor layers (e.g. nanoribbons) of the first fin. Other example dielectric materials for the first gate oxide layer include silicon oxycarbonitride (SiOCN), silicon oxycarbide (SiOC), or silicon oxynitride (SiON).

Method 500 continues with operation 512 where a second mask structure is formed over the semiconductor layers of the first fin (e.g., the first semiconductor material) and the second sacrificial dielectric layer is removed from around the second fin. Like operation 506, the second mask material may include any number of dielectric and/or hard mask layers and the second sacrificial dielectric layer may be removed using any suitable isotropic etching process.

Method 500 continues with operation 514 where a second gate oxide layer is formed on the semiconductor layers of the second fin (e.g., the second semiconductor material). A thermal oxidation process may be performed to form an oxide of the semiconductor material of the semiconductor layers (e.g. nanoribbons) of the second fin on all exposed surfaces of the semiconductor layers within the gate trench. For example, a portion of silicon semiconductor layers (e.g. nanoribbons) may be converted into silicon dioxide. Since the second gate oxide layer is formed from oxidation of the semiconductor material of the semiconductor layers (e.g. nanoribbons), the thickness of the semiconductor layers (e.g. nanoribbons) of the second fin is decreased where the second gate oxide layer is formed. For example, the thickness at a midpoint of the semiconductor layers (e.g. nanoribbons) of the first fin is thicker than a thickness at a midpoint of the semiconductor layers (e.g. nanoribbons) of the second fin. Other example dielectric materials for the second gate oxide layer include silicon oxycarbonitride (SiOCN), silicon oxycarbide (SiOC), or silicon oxynitride (SiON).

Example System

Figure 6:
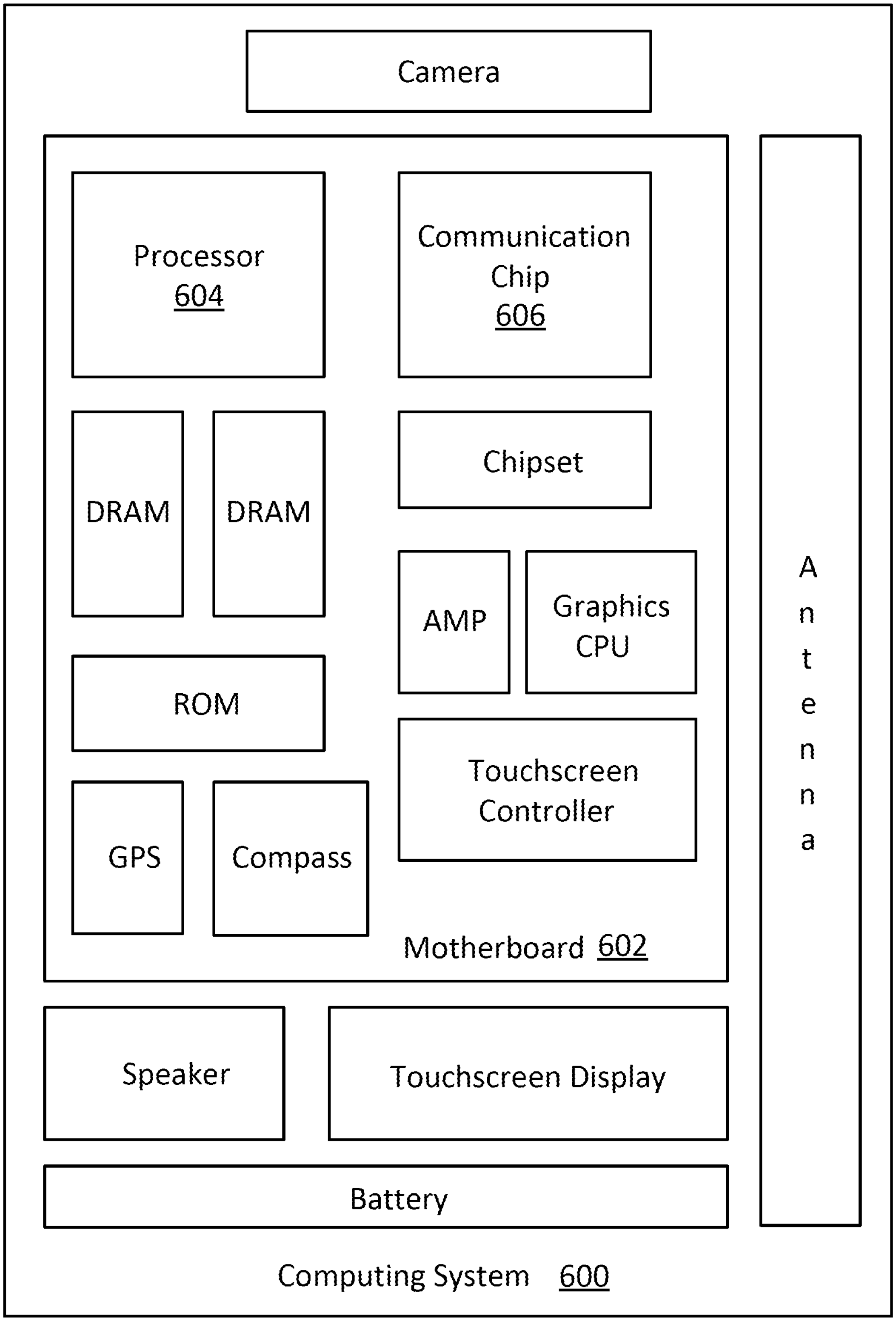
FIG. 6 illustrates a computing system including one or more integrated circuits, as variously described herein, in accordance with an embodiment of the present disclosure.

FIG. 6 is an example computing system implemented with one or more of the integrated circuit structures as disclosed herein, in accordance with some embodiments of the present disclosure. As can be seen, the computing system 600 houses a motherboard 602. The motherboard 602 may include a number of components, including, but not limited to, a processor 604 and at least one communication chip 606, each of which can be physically and electrically coupled to the motherboard 602, or otherwise integrated therein. As will be appreciated, the motherboard 602 may be, for example, any printed circuit board (PCB), whether a main board, a daughterboard mounted on a main board, or the only board of system 600, etc.

Depending on its applications, computing system 600 may include one or more other components that may or may not be physically and electrically coupled to the motherboard 602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with an example embodiment (e.g., a module including an integrated circuit on a substrate, the substrate having GAA semiconductor devices with different gate oxide thicknesses, as variously provided herein). In some embodiments, multiple functions can be integrated into one or more chips (e.g., for instance, note that the communication chip 606 can be part of or otherwise integrated into the processor 604).

The communication chip 606 enables wireless communications for the transfer of data to and from the computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing system 600 includes an integrated circuit die packaged within the processor 604. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 606 also may include an integrated circuit die packaged within the communication chip 606. In accordance with some such example embodiments, the integrated circuit die of the communication chip includes one or more semiconductor devices as variously described herein. As will be appreciated in light of this disclosure, note that multi-standard wireless capability may be integrated directly into the processor 604 (e.g., where functionality of any chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, the computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 600 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first semiconductor device having a first semiconductor region extending in a first direction between a first source region and a first drain region, and a first gate structure extending in a second direction over the first semiconductor region, and a second semiconductor device having a second semiconductor region extending in the first direction between a second source region and a second drain region, and a second gate structure extending in the second direction over the second semiconductor region. The first gate structure has a first gate dielectric structure and a first gate electrode on the first gate dielectric structure, and the second gate structure has a second gate dielectric structure and a second gate electrode on the second gate dielectric structure. The first gate dielectric structure includes a first gate oxide layer and the second gate dielectric structure includes a second gate oxide layer. The first gate oxide layer is at least 2 nm thicker than the second gate oxide layer.

Example 2 includes the integrated circuit of Example 1, wherein the first semiconductor region comprises a plurality of first semiconductor nanoribbons and the second semiconductor region comprises a plurality of second semiconductor nanoribbons.

Example 3 includes the integrated circuit of Example 2, wherein the plurality of first semiconductor nanoribbons and the plurality of second semiconductor nanoribbons comprise germanium, silicon, or a combination thereof.

Example 4 includes the integrated circuit of any one of Examples 1-3, wherein the first gate dielectric structure includes a first layer of high-k material and the second gate dielectric structure includes a second layer of high-k material.

Example 5 includes the integrated circuit of Example 4, wherein the first layer of high-k material and the second layer of high-k material each have substantially the same thickness.

Example 6 includes the integrated circuit of Example 4 or 5, wherein the first layer of high-k material and the second layer of high-k material each comprise hafnium and oxygen.

Example 7 includes the integrated circuit of any one of Examples 1-6, wherein the first gate oxide layer has a thickness between about 3 nm and about 5 nm.

Example 8 includes the integrated circuit of any one of Examples 1-3 or 7, wherein the first gate dielectric structure does not include a layer of high-k material and the second gate dielectric structure does include a layer of high-k material.

Example 9 includes the integrated circuit of any one of Examples 1-8, wherein the first semiconductor region comprises a first semiconductor nanoribbon and the second semiconductor region comprises a second semiconductor nanoribbon, and the first semiconductor nanoribbon has a midpoint thickness that is at least 1 nm thicker than a midpoint thickness of the second semiconductor nanoribbon.

Example 10 is a printed circuit board that includes the integrated circuit of any one of Examples 1-9.

Example 11 is an electronic device that includes a chip package having one or more dies. At least one of the one or more dies includes a first semiconductor device having a first semiconductor region extending in a first direction between a first source region and a first drain region, and a first gate structure extending in a second direction over the first semiconductor region, and a second semiconductor device having a second semiconductor region extending in the first direction between a second source region and a second drain region, and a second gate structure extending in the second direction over the second semiconductor region. The first gate structure has a first gate dielectric structure and a first gate electrode on the first gate dielectric structure, and the second gate structure has a second gate dielectric structure and a second gate electrode on the second gate dielectric structure. The first gate dielectric structure includes a first gate oxide layer and the second gate dielectric structure includes a second gate oxide layer. The first gate oxide layer is at least 2 nm thicker than the second gate oxide layer.

Example 12 includes the electronic device of Example 11, wherein the first semiconductor region comprises a plurality of first semiconductor nanoribbons and the second semiconductor region comprises a plurality of second semiconductor nanoribbons.

Example 13 includes the electronic device of Example 12, wherein the plurality of first semiconductor nanoribbons and the plurality of second semiconductor nanoribbons comprise germanium, silicon, or a combination thereof.

Example 14 includes the integrated circuit of any one of Examples 11-13, wherein the first gate dielectric structure includes a first layer of high-k material and the second gate dielectric structure includes a second layer of high-k material.

Example 15 includes the electronic device of Example 14, wherein the first layer of high-k material and the second layer of high-k material each have substantially the same thickness.

Example 16 includes the electronic device of Example 14 or 15, wherein the first layer of high-k material and the second layer of high-k material each comprise hafnium and oxygen.

Example 17 includes the integrated circuit of any one of Examples 11-16, wherein the first gate oxide layer has a thickness between about 3 nm and about 5 nm.

Example 18 includes the integrated circuit of any one of Examples 11-13 or 17, wherein the first gate dielectric structure does not include a layer of high-k material and the second gate dielectric structure does include a layer of high-k material.

Example 19 includes the integrated circuit of any one of Examples 11-18, further comprising a printed circuit board, wherein the chip package is coupled to the printed circuit board.

Example 20 is a method of forming an integrated circuit. The method includes forming a first fin structure comprising first semiconductor material, the first fin structure extending above a substrate and extending in a first direction; forming a second fin structure comprising second semiconductor material, the second fin structure extending above a substrate and extending in the first direction; forming a first sacrificial dielectric layer over the first fin structure and a second sacrificial dielectric layer over the second fin structure; forming a first mask structure over the second fin structure and removing the first sacrificial dielectric layer over the first fin structure; forming a crystalline silicon layer over the first semiconductor material; oxidizing the crystalline silicon layer to form a first gate oxide layer on the first semiconductor material; forming a second mask structure over the first semiconductor material and removing the second sacrificial dielectric layer over the second fin structure; and forming a second gate oxide layer on the second semiconductor material, wherein the first gate oxide layer is at least 2 nm thicker than the second gate oxide layer.

Example 21 includes the method of Example 20, further comprising forming a first sacrificial layer extending over the first semiconductor material in a second direction different from the first direction; forming first spacer structures on sidewalls of the first sacrificial layer; forming a second sacrificial layer extending over the second semiconductor material in the second direction; forming second spacer structures on sidewalls of the second sacrificial layer; and removing both the first sacrificial layer and the second sacrificial layer to reveal a first trench having the first fin structure between the first spacer structures a second trench having the second fin structure between the second spacer structures.

Example 22 includes the method of Example 21, further comprising forming a first gate electrode over the first gate oxide within the first trench; and forming a second gate electrode over the second gate oxide within the second trench.

Example 23 includes the method of any one of Examples 20-22, further comprising removing the second mask structure; and forming a layer of high-k material on both the first gate oxide layer and the second gate oxide layer.

Example 24 includes the method of Example 23, wherein the layer of high-k material comprises hafnium and oxygen.

Example 25 includes the method of any one of Examples 20-22, further comprising forming a layer of high-k material on the second gate oxide layer and on the second mask structure; and removing the second mask structure and the layer of high-k material on the second mask structure.

Example 26 includes the method of Example 25, wherein the second mask structure comprises titanium and nitrogen.

Example 27 includes the method of any one of Examples 20-26, wherein the first gate oxide layer has a thickness between about 3 nm and about 5 nm.

Example 28 is an integrated circuit that includes a first semiconductor device having a plurality of first semiconductor nanoribbons extending in a first direction between a first source region and a first drain region, and a first gate structure extending in a second direction over the plurality of first semiconductor nanoribbons, and a second semiconductor device having a plurality of second semiconductor nanoribbons extending in the first direction between a second source region and a second drain region, and a second gate structure extending in the second direction over the plurality of second semiconductor nanoribbons. The first gate structure has a first gate dielectric structure and a first gate electrode on the first gate dielectric structure, and the second gate structure has a second gate dielectric structure and a second gate electrode on the second gate dielectric structure. The first gate dielectric structure includes a first gate oxide layer and the second gate dielectric structure includes a second gate oxide layer. The first gate oxide layer is thicker than the second gate oxide layer. The nanoribbons of the plurality of first semiconductor nanoribbons have a greater midpoint thickness compared to a midpoint thickness of the nanoribbons of the plurality of second semiconductor nanoribbons.

Example 29 includes the integrated circuit of Example 28, wherein the plurality of first semiconductor nanoribbons and the plurality of second semiconductor nanoribbons comprise germanium, silicon, or a combination thereof.

Example 30 includes the integrated circuit of Example 28 or 29, wherein the first gate dielectric structure includes a first layer of high-k material and the second gate dielectric structure includes a second layer of high-k material.

Example 31 includes the integrated circuit of Example 30, wherein the first layer of high-k material and the second layer of high-k material each have substantially the same thickness.

Example 32 includes the integrated circuit of Example 30 or 31, wherein the first layer of high-k material and the second layer of high-k material each comprise hafnium and oxygen.

Example 33 includes the integrated circuit of any one of Examples 28-32, wherein the first gate oxide layer has a thickness between about 3 nm and about 5 nm.

Example 34 includes the integrated circuit of any one of Examples 28, 29, or 33, wherein the first gate dielectric structure does not include a layer of high-k material and the second gate dielectric structure does include a layer of high-k material.

Example 35 includes the integrated circuit of any one of Examples 28-34, wherein the midpoint thickness of a given one of the first semiconductor nanoribbons is in the range of 12 angstroms to 20 angstroms thicker than the midpoint thickness of a given one of the second semiconductor nanoribbons.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

a first semiconductor device having a first plurality of semiconductor bodies extending in a first direction between a first source region and a first drain region, and a first gate structure extending in a second direction over the first plurality of semiconductor bodies, the first gate structure having a first gate dielectric structure and a first gate electrode on the first gate dielectric structure, wherein each semiconductor body of the first plurality of semiconductor bodies has a first midpoint thickness; and a second semiconductor device having a second plurality of semiconductor bodies extending in the first direction between a second source region and a second drain region, and a second gate structure extending in the second direction over the second plurality of semiconductor bodies, the second gate structure having a second gate dielectric structure and a second gate electrode on the second gate dielectric structure, wherein each semiconductor body of the second plurality of semiconductor bodies has a second midpoint thickness that is at least 1 nm less than the first midpoint thickness;

wherein the first gate dielectric structure includes a first gate oxide layer and the second gate dielectric structure includes a second gate oxide layer, wherein the first gate oxide layer is at least 2 nm thicker than the second gate oxide layer.

2. The integrated circuit of claim 1, wherein the first plurality of semiconductor bodies comprises a plurality of first semiconductor nanoribbons and the second plurality of semiconductor bodies comprises a plurality of second semiconductor nanoribbons.

3. The integrated circuit of claim 1, wherein the first gate dielectric structure includes a first layer of high-k material and the second gate dielectric structure includes a second layer of high-k material.

4. The integrated circuit of claim 3, wherein the first layer of high-k material and the second layer of high-k material each have substantially the same thickness.

5. The integrated circuit of claim 3, wherein the first layer of high-k material and the second layer of high-k material each comprise hafnium and oxygen.

6. The integrated circuit of claim 1, wherein the first gate dielectric structure does not include a layer of high-k material and the second gate dielectric structure does include a layer of high-k material.

7. A printed circuit board comprising the integrated circuit of claim 1.

8. An electronic device, comprising:

a chip package comprising one or more dies, at least one of the one or more dies comprising a first semiconductor device having a first plurality of semiconductor nanoribbons extending in a first direction between a first source region and a first drain region, and a first gate structure extending in a second direction over the first plurality of semiconductor nanoribbons, the first gate structure having a first gate dielectric structure and a first gate electrode on the first gate dielectric structure, wherein each nanoribbon of the first plurality of semiconductor nanoribbons has a first midpoint thickness; and a second semiconductor device having a second plurality of semiconductor nanoribbons extending in the first direction between a second source region and a second drain region, and a second gate structure extending in the second direction over the second plurality of semiconductor nanoribbons, the second gate structure having a second gate dielectric structure and a second gate electrode on the second gate dielectric structure, wherein each nanoribbon of the second plurality of semiconductor nanoribbons has a second midpoint thickness that is at least 1 nm less than the first midpoint thickness;

wherein the first gate dielectric structure includes a first gate oxide layer and the second gate dielectric structure includes a second gate oxide layer, wherein the first gate oxide layer is at least 2 nm thicker than the second gate oxide layer.

9. The electronic device of claim 8, wherein the first gate dielectric structure includes a first layer of high-k material and the second gate dielectric structure includes a second layer of high-k material.

10. The electronic device of claim 9, wherein the first layer of high-k material and the second layer of high-k material each comprise hafnium and oxygen.

11. The electronic device of claim 8, wherein the first gate dielectric structure does not include a layer of high-k material and the second gate dielectric structure does include a layer of high-k material.

12. The electronic device of claim 8, further comprising a printed circuit board, wherein the chip package is coupled to the printed circuit board.

13. An integrated circuit comprising:

a first semiconductor device having a plurality of first semiconductor nanoribbons extending in a first direction between a first source region and a first drain region, and a first gate structure extending in a second direction over the plurality of first semiconductor nanoribbons, the first gate structure having a first gate dielectric structure and a first gate electrode on the first gate dielectric structure; and a second semiconductor device having a plurality of second semiconductor nanoribbons extending in the first direction between a second source region and a second drain region, and a second gate structure extending in the second direction over the plurality of second semiconductor nanoribbons, the second gate structure having a second gate dielectric structure and a second gate electrode on the second gate dielectric structure;

wherein the first gate dielectric structure includes a first gate oxide layer and the second gate dielectric structure includes a second gate oxide layer, wherein the first gate oxide layer is thicker than the second gate oxide layer, and wherein each nanoribbon of the plurality of first semiconductor nanoribbons has a first midpoint thickness and each nanoribbon of the plurality of second semiconductor nanoribbons has a second midpoint thickness that is at least 1 nm less than the first midpoint thickness.

14. The integrated circuit of claim 13, wherein the first gate dielectric structure includes a first layer of high-k material and the second gate dielectric structure includes a second layer of high-k material.

15. The integrated circuit of claim 14, wherein the first layer of high-k material and the second layer of high-k material each have substantially the same thickness.

16. The integrated circuit of claim 14, wherein the first layer of high-k material and the second layer of high-k material each comprise hafnium and oxygen.

17. The integrated circuit of claim 13, wherein the first gate dielectric structure does not include a layer of high-k material and the second gate dielectric structure does include a layer of high-k material.

18. The integrated circuit of claim 13, wherein the first midpoint thickness is in the range of 12 angstroms to 20 angstroms greater than the second midpoint thickness, and wherein the first gate oxide layer has a thickness between 3 nm and 5 nm.

19. The integrated circuit of claim 1, wherein the first gate oxide layer has a thickness between 3 nm and 5 nm.

20. The electronic device of claim 8, wherein the first gate oxide layer has a thickness between 3 nm and 5 nm.

* * * * *